United States Patent
Burkhart et al.

(10) Patent No.: US 9,879,795 B2
(45) Date of Patent: Jan. 30, 2018

(54) ADDITIVELY MANUFACTURED GAS DISTRIBUTION MANIFOLD

(71) Applicant: Lam Research Corporation, Fremont, CA (US)

(72) Inventors: Christopher William Burkhart, Los Gatos, CA (US); Andrew C. Lee, Daly City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/997,419

(22) Filed: Jan. 15, 2016

(65) Prior Publication Data

US 2017/0204989 A1 Jul. 20, 2017

(51) Int. Cl.
*F16K 11/00* (2006.01)
*F16K 27/00* (2006.01)
(Continued)

(52) U.S. Cl.
CPC ............ *F16K 27/003* (2013.01); *B33Y 80/00* (2014.12); *C23C 16/45561* (2013.01);
(Continued)

(58) Field of Classification Search
CPC ....... Y10T 137/87684; Y10T 137/8788; Y10T 137/87249; Y10T 137/87652;
(Continued)

(56) References Cited

U.S. PATENT DOCUMENTS 4,545,328 A * 10/1985 Fujiyama ................ C23C 14/56
118/50.1
5,836,355 A 11/1998 Markulec et al.
(Continued)

FOREIGN PATENT DOCUMENTS

JP 2003-334479 A 11/2003
JP 2004-214591 A 7/2004
(Continued)

OTHER PUBLICATIONS

PCT International Search Report and Written Opinion dated Dec. 28, 2015 issued in PCT/US2015/0555997.
(Continued)

*Primary Examiner* — Atif Chaudry
(74) *Attorney, Agent, or Firm* — Weaver Austin Villeneuve & Sampson LLP

(57) ABSTRACT

A manifold constructed by additive manufacturing for use in semiconductor processing tools is provided. The manifold may include a mixing chamber and portions of a plurality of flow paths with each flow path including a first fluid flow component interface, a second fluid flow component interface, a first tubular passage fluidically connecting the first mixing chamber with a first fluid flow component interface outlet of that flow path, and a second tubular passage fluidically connecting a first fluid flow component interface inlet of that flow path with a second fluid flow component interface outlet of that flow path. Each fluid flow component interface is configured to interface with a corresponding fluid flow component such that the corresponding fluid flow component, when installed, is able to interact with fluid flow between the fluid flow component interface inlet and the fluid flow component interface outlet.

23 Claims, 21 Drawing Sheets

(51) Int. Cl.
*F17D 1/00* (2006.01)
*H01J 37/32* (2006.01)
*C23C 16/455* (2006.01)
*B33Y 80/00* (2015.01)

(52) U.S. Cl.
CPC ............ *F16K 19/00* (2013.01); *F17D 1/00* (2013.01); *H01J 37/3244* (2013.01); *H01J 37/32449* (2013.01); *Y10T 137/87249* (2015.04); *Y10T 137/87652* (2015.04); *Y10T 137/87684* (2015.04); *Y10T 137/87885* (2015.04)

(58) Field of Classification Search
CPC .... F16K 27/003; F16K 19/00; H01J 37/3244; H01J 37/32449; C23C 16/45561; F17D 1/00
See application file for complete search history.

(56) References Cited

U.S. PATENT DOCUMENTS

| | | | |
|---|---|---|---|
| 6,068,016 A | 5/2000 | Manofsky, Jr. et al. | |
| 6,073,646 A | 6/2000 | Kimura | |
| 6,186,177 B1 | 2/2001 | Maher | |
| 6,260,581 B1 | 7/2001 | Hollingshead | |
| 6,283,143 B1 | 9/2001 | Adachi, Jr. et al. | |
| 6,302,141 B1 | 10/2001 | Markulec et al. | |
| 6,440,504 B1* | 8/2002 | Akiyama | C23C 16/24 118/723 E |
| 6,546,960 B1 | 4/2003 | Rohrberg et al. | |
| 6,581,640 B1 | 6/2003 | Barron | |
| 6,640,835 B1 | 11/2003 | Rohrberg et al. | |
| 6,648,020 B2 | 11/2003 | Fujimoto et al. | |
| 6,753,200 B2 | 6/2004 | Craighead et al. | |
| 6,880,745 B2 | 4/2005 | Stueber et al. | |
| 6,907,904 B2 | 6/2005 | Harris et al. | |
| 7,055,550 B2 | 6/2006 | Harris et al. | |
| 7,126,094 B2 | 10/2006 | Bower et al. | |
| 7,150,475 B2 | 12/2006 | Eriksson et al. | |
| 7,178,556 B2 | 2/2007 | Reid, II et al. | |
| 7,195,037 B2 | 3/2007 | Eidsmore | |
| 7,225,835 B2 | 6/2007 | Vu | |
| 7,234,222 B1 | 6/2007 | Hao et al. | |
| 7,299,825 B2 | 11/2007 | Milburn | |
| 7,307,247 B2 | 12/2007 | Bower et al. | |
| 7,320,339 B2 | 1/2008 | Milburn | |
| 7,334,605 B2 | 2/2008 | Vu | |
| 7,404,417 B2 | 7/2008 | Eidsmore | |
| 7,410,519 B1* | 8/2008 | Ewald | F16K 27/003 137/544 |
| 7,789,107 B2 | 9/2010 | Eriksson et al. | |
| 7,798,388 B2 | 9/2010 | Crockett et al. | |
| 7,892,357 B2 | 2/2011 | Srivastava | |
| 8,122,910 B2 | 2/2012 | Taskar | |
| 8,196,480 B1 | 6/2012 | Mayeaux | |
| 8,196,609 B2 | 6/2012 | Oya et al. | |
| 8,322,380 B2 | 12/2012 | Taskar | |
| 8,340,827 B2 | 12/2012 | Yun et al. | |
| 8,521,461 B2 | 8/2013 | Shareef et al. | |
| 8,746,284 B2 | 6/2014 | DeDontney | |
| 8,794,267 B2 | 8/2014 | Shareef et al. | |
| 8,846,183 B2 | 9/2014 | Unger et al. | |
| 8,851,113 B2 | 10/2014 | Taskar et al. | |
| 8,852,685 B2 | 10/2014 | Kenworthy et al. | |
| 2002/0017329 A1* | 2/2002 | Fukushima | F16K 27/003 137/884 |
| 2003/0124842 A1 | 7/2003 | Hytros et al. | |
| 2004/0092118 A1 | 5/2004 | Johnson et al. | |
| 2004/0189311 A1* | 9/2004 | Glezer | B01L 3/5027 324/444 |
| 2005/0005981 A1 | 1/2005 | Eidsmore et al. | |
| 2005/0284529 A1* | 12/2005 | Iwabuchi | F15B 13/0814 137/884 |
| 2008/0066859 A1 | 3/2008 | Kobayashi et al. | |
| 2012/0237696 A1 | 9/2012 | Huseinovic et al. | |
| 2013/0025718 A1* | 1/2013 | Nagase | B01J 4/02 137/597 |
| 2013/0255782 A1 | 10/2013 | Shareef et al. | |
| 2013/0255883 A1 | 10/2013 | Shareef et al. | |
| 2014/0020779 A1 | 1/2014 | Vu | |
| 2014/0076236 A1 | 3/2014 | Sankarakrishnan et al. | |
| 2014/0137961 A1 | 5/2014 | Kao et al. | |
| 2014/0182689 A1 | 7/2014 | Shareef et al. | |
| 2015/0362080 A1* | 12/2015 | Vu | F16K 1/42 137/1 |
| 2016/0108523 A1 | 4/2016 | Lee et al. | |
| 2016/0111257 A1 | 4/2016 | Kellogg et al. | |
| 2017/0057028 A1 | 3/2017 | Kellogg et al. | |

FOREIGN PATENT DOCUMENTS

| | | |
|---|---|---|
| KR | 10-2009-0125681 | 12/2009 |
| WO | WO 2014/199158 A1 | 12/2014 |
| WO | WO 2016/061493 A1 | 4/2016 |

OTHER PUBLICATIONS

"MicroSeal™ Product Selection Guide," *Microflex Technologies*, (2004), 6 pages.

"Metal Seal Design Guide, High Performance Engineered Seals and Sealing Systems," *Parker Hannifin Corporation, Composite Sealing Systems Division*, (2013), 106 pages.

U.S. Appl. No. 15/087,889, filed Mar. 31, 2016, Burkhart et al.

U.S. Office Action, dated Jun. 22, 2017, issued in U.S. Appl. No. 14/517,192.

U.S. Office Action, dated Aug. 4, 2017, issued in U.S. Appl. No. 14/884,575.

U.S. Office Action dated Dec. 15, 2017, issued in U.S. Appl. No. 15/087,889.

\* cited by examiner

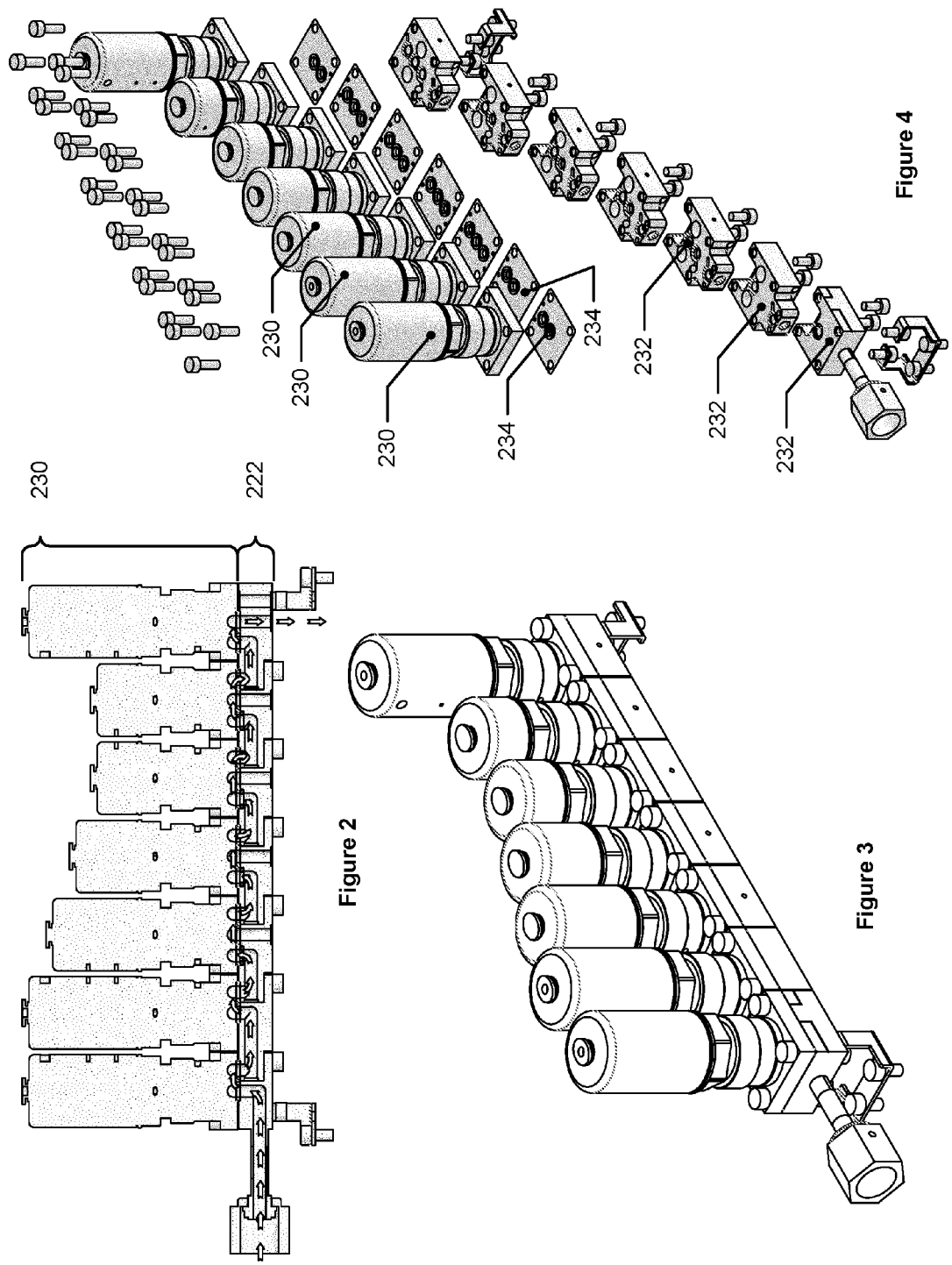

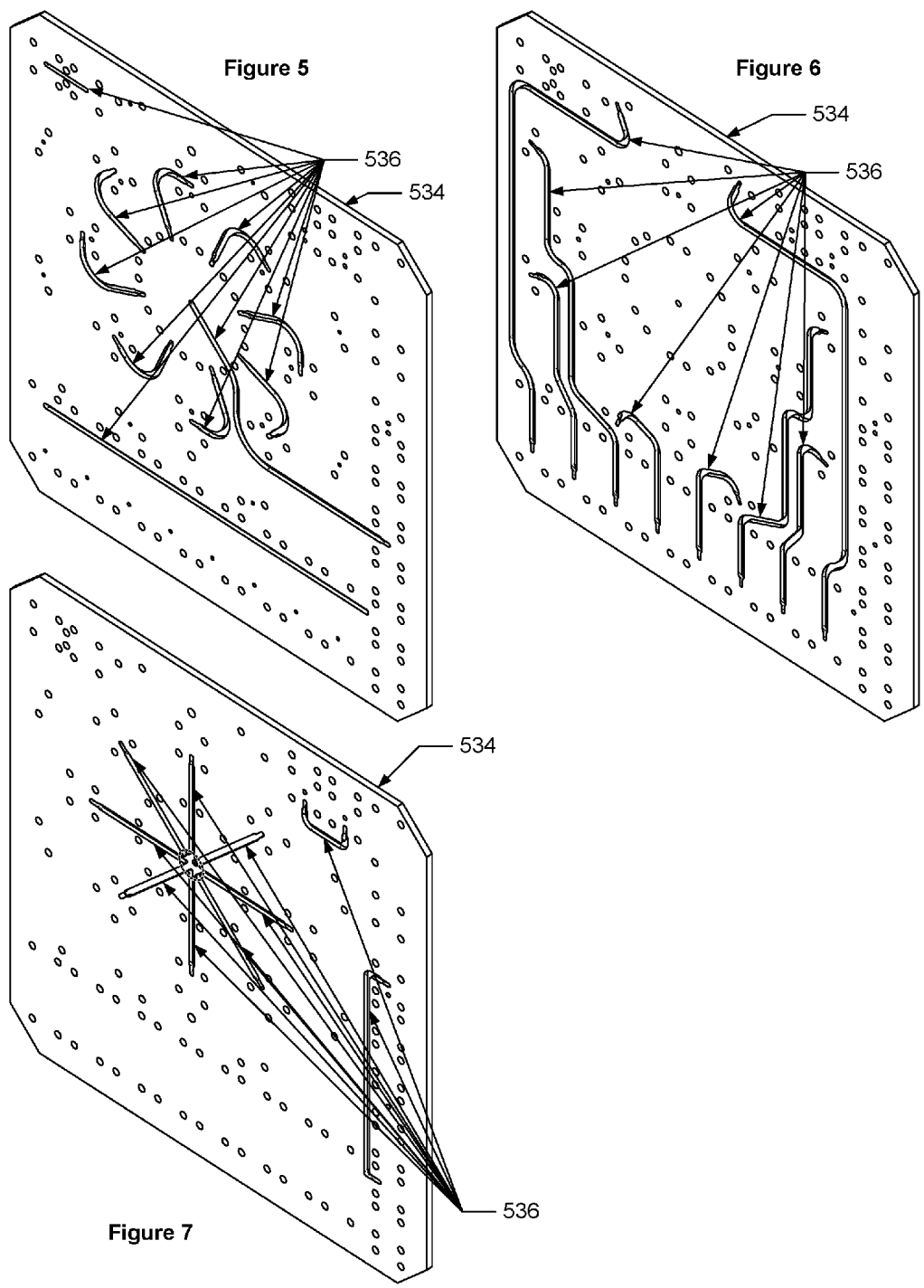

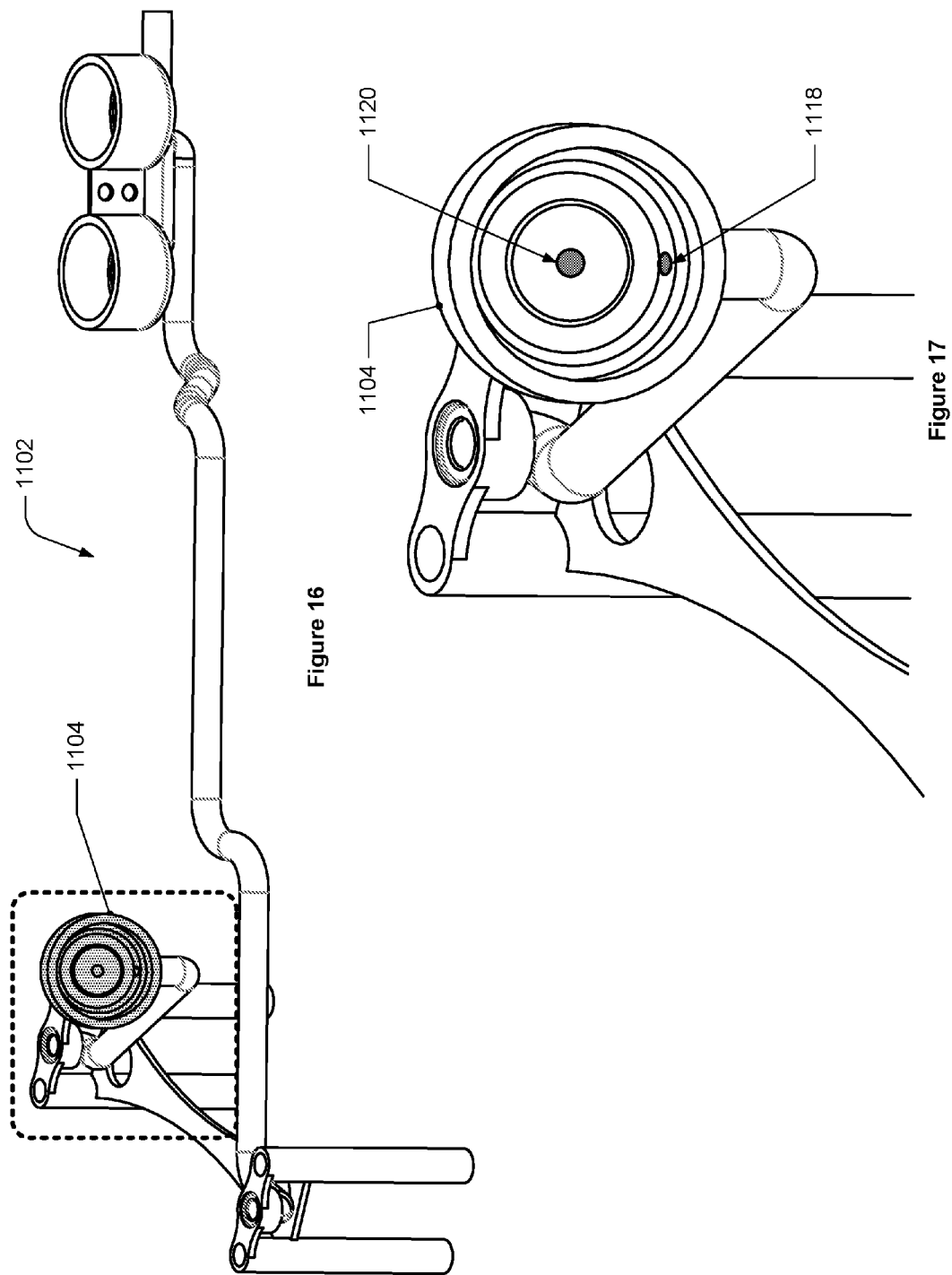

ADDITIVELY MANUFACTURED GAS DISTRIBUTION MANIFOLD

BACKGROUND

Semiconductor manufacturing processes utilize a variety of different types of process gases that must be delivered with precise timing, in precise quantities, and/or at precise delivery rates and ratios. In some cases, a semiconductor processing tool may utilize ten or more process gases, e.g., 14 different process gases, each of which must have its own separate control hardware. This collection of control hardware, which may include valves, mass flow controllers (MFCs), tubing, fittings, etc., is typically housed in a "gas box," which is an enclosure or other structure that is typically mounted to the semiconductor processing tool (or in another location nearby).

BRIEF DESCRIPTION OF THE DRAWINGS

FIGS. 2 through 4 show an example of a modular substrate gas stick.

FIGS. 5 through 7 depict three example layers of a monolithic substrate.

FIG. 16 depicts an off-angle view of the first flow path of FIG. 12.

FIG. 17 depicts a detail view of a portion of the first flow path from FIG. 16.

SUMMARY

Figure 1:
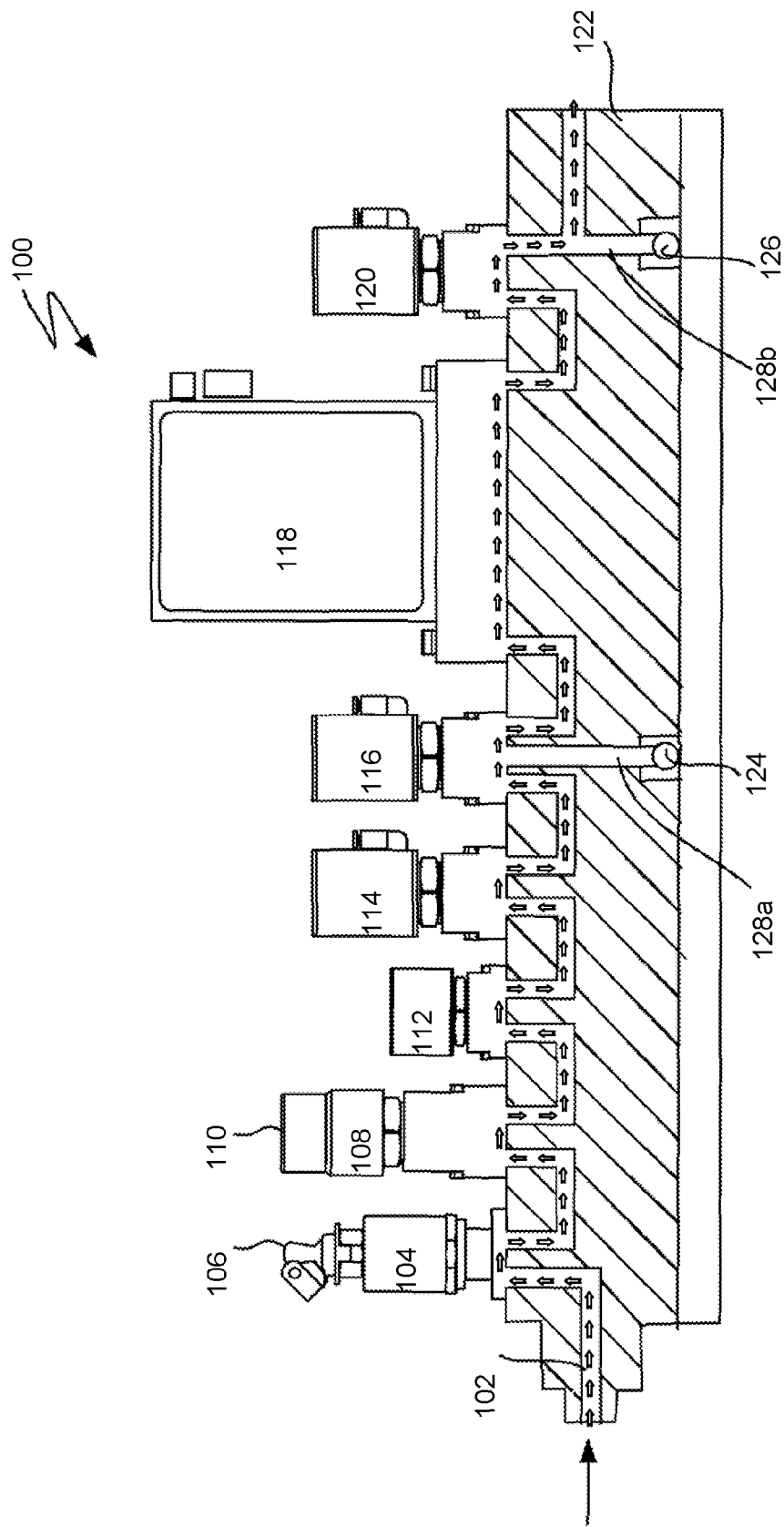
FIG. 1 depicts an example of a gas stick arrangement used in some conventional gas boxes.

In one embodiment, an apparatus may be provided. The apparatus may include a manifold constructed by additive manufacturing, and the manifold may include a mixing chamber and portions of a plurality of flow paths. Each flow path may include a first fluid flow component interface including a first fluid flow component interface inlet and a first fluid flow component interface outlet, a second fluid flow component interface including a second fluid flow component interface inlet and a second fluid flow component interface outlet, a first tubular passage fluidically connecting the mixing chamber with the first fluid flow component interface outlet of that flow path, and a second tubular passage fluidically connecting the first fluid flow component interface inlet of that flow path with the second fluid flow component interface outlet of that flow path. Each first fluid flow component interface may be fluidically interposed between the first tubular passage of that flow path and the second tubular passage of that flow path, each first fluid flow component interface may be configured to interface with a corresponding first fluid flow component such that the corresponding first fluid flow component, when installed, is able to interact with fluid flow between the first fluid flow component interface inlet and the first fluid flow component interface outlet, and each second fluid flow component interface may be configured to interface with a corresponding second fluid flow component such that the corresponding second fluid flow component, when installed, is able to interact with fluid flow between the second fluid flow component interface inlet and the second fluid flow component interface outlet.

In some embodiments, for at least one of the flow paths, at least one of the first tubular passage and the second tubular passage may follow a three-dimensional path.

In some embodiments, at least the majority of the manifold may have a sintered structure.

In some embodiments, the manifold may be made from a material such as a sintered metal, a sintered metal alloy, and a sintered ceramic.

In some embodiments, each first fluid flow component interface may be configured to interface with the corresponding first fluid flow component such that the corresponding first fluid flow component, when installed, is able to interact with fluid flow between the first fluid flow component interface inlet and the first fluid flow component interface outlet by regulating the fluid flow between the first fluid flow component interface inlet and the first fluid flow component interface outlet.

In some embodiments, each second fluid flow component interface may be configured to interface with the corresponding second fluid flow component such that the corresponding second fluid flow component, when installed, is able to interact with fluid flow between the second fluid flow component interface inlet and the second fluid flow component interface outlet by regulating the fluid flow between the second fluid flow component interface inlet and the second fluid flow component interface outlet.

In one such embodiment, each flow path may further include a third fluid flow component interface including a third fluid flow component interface inlet and a third fluid flow component interface outlet and a third tubular passage fluidically connecting the second fluid flow component interface inlet of that flow path with the third fluid flow component interface outlet of that flow path. Each second fluid flow component interface may be fluidically interposed between the second tubular passage of that flow path and the third tubular passage of that flow path and each third fluid flow component interface may be configured to interface with a corresponding third fluid flow component such that the corresponding third fluid flow component, when installed, is able to interact with fluid flow between the third fluid flow component interface inlet and the third fluid flow component interface outlet.

In further such embodiments, each third fluid flow component interface may be configured to interface with the corresponding third fluid flow component such that the corresponding third fluid flow component, when installed, is able to interact with fluid flow between the third fluid flow component interface inlet and the third fluid flow component interface outlet by regulating the fluid flow between the third fluid flow component interface inlet and the third fluid flow component interface outlet.

In further such embodiments, each flow path may further include a fourth fluid flow component interface including a fourth fluid flow component interface inlet and a fourth fluid flow component interface outlet and a fourth tubular passage fluidically connecting the fourth fluid flow component interface inlet of that flow path with the third tubular passage of that flow path. Each fourth fluid flow component interface outlet may be fluidically connected to the fourth fluid flow component interface and each fourth fluid flow component interface may be configured to interface with a corresponding fourth fluid flow component such that the corresponding fourth fluid flow component, when installed, is able to interact with fluid flow between the fourth fluid flow component interface inlet and the fourth fluid flow component interface outlet.

In some embodiments, the first tubular passages and the first fluid flow component interfaces may be arranged in a radial pattern around a first axis.

In some embodiments, the manifold may further include one or more structural supports that span between (a) one or more portions of one of the flow paths, such as the first tubular passage of that flow path, the second tubular passage of that flow path, the first fluid flow component interface of that flow path, and the second fluid flow component interface of that flow path and (b) one or more portions of one of the other flow paths, such as the first tubular passage of that other flow path, the second tubular passage of that other flow path, the first fluid flow component interface of that other flow path, and the second fluid flow component interface of that other flow path.

In some embodiments, one or more portions of one or more bends in the first tubular passage may have a bend radius less than ten times the outside diameter of the first tubular passage.

In some embodiments, one or more portions of one or more bends in the second tubular passage may have a bend radius less than ten times the outside diameter of the second tubular passage.

In some embodiments, each first tubular passage may have a plurality of first bends and 85% or more of the first bends may be free of internal sharp edges, and each second tubular passage may have a plurality of second bends and 85% or more of the second bends may be free of internal sharp edges.

In some embodiments, for at least one of the flow paths, at least one of the first fluid flow component interface and the second fluid flow component interface is a bore-type interface.

In some embodiments, for at least one of the flow paths, at least one of the first fluid flow component interface and the second fluid flow component interface may be a surface mount interface.

In some embodiments, for at least one of the flow paths, at least one of the first fluid flow component interface and the second fluid flow component interface may be an interface provided by two different, non-contiguous interface surfaces.

In one such embodiment, the apparatus may further include a plurality of first fluid flow components and each first fluid flow component may be mounted to the manifold such that each first fluid flow component is fluidically connected with a corresponding one of the first fluid flow component interfaces.

In further such embodiments, the apparatus may further include a plurality of second fluid flow components and each second fluid flow component may be mounted to the manifold such that each second fluid flow component is fluidically connected with a corresponding one of the second fluid flow component interfaces.

In some embodiments, each of the first tubular passages may be the same length as the other first tubular passages.

In some embodiments, one or more of the first tubular passages may have an interior surface with an arithmetic average surface roughness ($R_a$) of 10 microinches or less and one or more of the second tubular passages may have an interior surface with an arithmetic average surface roughness ($R_a$) of 10 microinches or less.

In one such embodiment, the manifold may occupy 35% or less of the smallest prismatic rectangular volume that can completely contain the manifold.

In further such embodiments, the height and the width of the smallest prismatic rectangular volume that can completely contain the manifold each measure between about 15 inches and about 20 inches.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific implementations, it will be understood that these implementations are not intended to be limiting.

There are many concepts and implementations described and illustrated herein. While certain features, attributes and advantages of the implementations discussed herein have been described and illustrated, it should be understood that many others, as well as different and/or similar implementations, features, attributes and advantages of the present inventions, are apparent from the description and illustrations. As such, the below implementations are merely some possible examples of the present disclosure. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description below because the description of the above implementations has been presented for the purposes of illustration and description.

Importantly, the present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

Semiconductor processes typically utilize a large number of different types of processing gases and/or liquids. These fluids may need to be individually controlled to a high degree of precision to ensure that the proper quantities and ratios of gases are delivered to the semiconductor processing chamber (or chambers) where semiconductor processing occurs at the right time and in the right sequence—it is to be understood that the term "fluid," as used herein, may refer to either a gas or a liquid. To provide such fluidic control, semiconductor processing tools usually include, or are connected with, a "gas box," which is a complex assembly of fluid flow components, such as valves, mass flow controllers (MFCs), fittings, tubes, manifold blocks, etc.

As discussed in further detail below, the inventors of the present disclosure have discovered that many current gas boxes may include numerous disadvantages and/or limitations, such as flow paths that may have sharp internal edges, overhangs, gaps, dead zones, misalignments, and/or discontinuities which may adversely affect fluid flow. Moreover, the present inventors have found that traditional manufacturing techniques of current gas boxes are limited in the flow path configurations that can be constructed such that they cannot create intricate, tightly packed flow paths that follow a three-dimensional path and/or have bends without internal sharp edges.

In a typical gas box, each processing fluid may have an associated "gas stick," which is typically a linear arrangement of shut-off valves, mixing valves, MFCs (if used), fittings, tubing, filters, pressure regulators, and/or manifold blocks. These gas sticks, which may also be used for liquid reactants (despite the name referring to "gas"), may then be arranged in a linear fashion, side-by-side, and connected to a common trunk line. In such arrangements, the average flow direction of each gas stick may typically be perpendicular to the average flow direction of the trunk line.

In a typical gas stick, the fluid flow components are laid out in a generally sequential manner. FIG. 1 depicts an example of a typical gas stick arrangement used in some conventional gas boxes.

Referring to FIG. 1, the gas stick 100 may have a gas stick input port 102 that may be connected to a supply fluid source, e.g., a facility gas source. A manual valve 104 may be used to allow for the supply or isolation of the supply fluid source from the gas stick (or vice versa). The manual valve 104 may also have a lockout/tagout device 106 that prevents the manual valve 104 from being operated until the lockout is disengaged, or that indicates prominently that the valve is in-use and should not be operated except by the person who set the tag.

A regulator 108 may be used to regulate the pressure of the supply fluid, e.g., the pressure of a supply gas, and a pressure gauge 110 may be used to monitor the pressure of the supply fluid. In one implementation, the pressure may be preset and not need to be regulated. In another implementation, a pressure transducer (not illustrated) having a display to display the pressure may be used. The pressure transducer may be positioned next to the regulator 108. A filter 112 may be used to remove impurities in the supply fluid. A primary shut-off valve 114 may be used to prevent any corrosive supply fluids from remaining in the gas stick. The primary shut-off valve 114 may be a two-port valve having an automatic pneumatically operated valve assembly that causes the valve to become deactivated (closed), which in turn effectively stops fluid flow within the gas stick. Once deactivated, a non-corrosive purge gas, such as nitrogen, may be used to purge the gas stick. The purge valve 116 may have three ports to provide for the purge process—an entrance port, an exit port and a discharge port.

Adjacent the purge valve 116 may be a mass flow controller ("MFC") 118. The MFC 118 may be used to accurately measure and control the flow rate of the supply fluid, e.g., supply gas. Positioning the purge valve 116 next to the MFC 118 allows a user to purge any corrosive supply fluids in the MFC 118. A mixing valve (or secondary valve) 120 next to the MFC 118 may be used to release the amount of supply fluid to be mixed with other supply fluids in the gas box.

Each component of the gas stick 100 may be positioned above a manifold block. The aforementioned fluid flow components may be positioned on the manifold blocks through any of a variety of mechanisms, e.g, threaded interfaces, flange plates with threaded fasteners, etc. There may be additional flow paths for additional fluid flow, such as purge or other reactant liquids, that may flow through the substrate 122 in flow components 124 and 128a, which may be part of a purge flow system/path; and flow components 126 and 128b, which may be part of another reactant flow system/path.

In some arrangements, the gas stick 100 may include a modular substrate. FIGS. 2 through 4 show an example of a modular substrate gas stick. In FIG. 2, the substrate 222 can be seen with the layer of gas flow components 230. FIG. 3 depicts an isometric view of the modular gas stick. Substrate 222 is of a modular design which includes multiple interchangeable parts which are connected to each other with seals, which each introduce potential failure points in the gas stick assembly. Since substrate 222 is made up of multiple parts, it allows for a LEGO® type construction, which provides flexibility in how each gas stick is assembled, which is discussed in further detail below in FIG. 4. However, this design causes the flow path between gas supply components to become long, which increases fluid flow path lengths and thus transit time of gases, and introduces multiple failure points in the gas stick. For example, there may be more sites where leaks may occur, and such configurations may include more interfaces which may have manufacturing defects, tolerance or stackup problems, and/or misalignment of components. In some conventional semiconductor processing gas boxes, a gas box includes discrete gas sticks, built up on discrete substrates such as the modular substrate 222, that are then mounted to a common mounting plate—the fluid flow passages in such conventional gas boxes are provided by the discrete substrates and are not included in the mounting plate.

In FIG. 4, the individual piece-parts of the modular substrate are clearly shown in the exploded view. Each such modular piece-part 232 may interlock with the adjacent modular piece-part 232 and the two interlocked piece-parts 232 may then be bolted together. Once the assembled substrate is complete, then the gas flow components 230, which, in this example, are all valves or sensors of various types, may be assembled to the assembled substrate. Seals 234 may be interposed between the gas flow components 230 and the piece-parts 232 in order to provide a gas-tight seal interface. The gas flow path through such a modular gas stick assembly is represented by the flow arrows in FIG. 2; it is to be understood that the internal features of the valves and sensors in this example are not depicted, although such valves may be any of a variety of surface-mount valve technologies readily available in the industry.

In such arrangements, each gas stick may be located a different distance from the end of the trunk line that serves as the supply to the semiconductor processing chamber. In such arrangements, it may take longer for gases that are introduced into the trunk line further from such a supply end to reach the supply end than gases that are introduced into the trunk line closer to the supply end. In some of these arrangements, a high-flow carrier gas may be introduced into the trunk line to convey lower-flow process gases from the gas sticks to the supply end of the trunk line in a more rapid fashion, which may reduce the time it takes to deliver process fluids to the trunk line supply end.

As mentioned above, a gas delivery system that uses gas sticks may have numerous drawbacks, e.g., long flow path lengths that increase transit time of gases and introduces multiple failure points, these gas sticks may be very space consuming, difficult to access, and difficult to maintain due to, for example, a high packing density of the components. Furthermore, some such systems may require a large amount of tubing, fittings, machined blocks, machined manifolds, and gaskets, which may further increase cost, decrease access and maintainability, as well as introduce more potential failure points into the system.

Another example gas box may be a monolithic structure that includes gas-tight channels that are in fluidic connection with each other. This monolithic structure may include a gas delivery substrate for mounting gas supply components of a gas delivery system that may be formed from stacked layers which are bonded together to create a uniform monolithic structure that is configured to receive and mount gas supply components such that the gas supply components are in fluidic communication with each other via channels within the substrate. FIGS. 5 through 7 depict three example layers of a monolithic substrate. As can be seen, each layer includes different flow paths which may be fluidically connected to other flow paths in other layers and may be configured in various shapes and sizes. For example, FIG. 5 shows a first example layer 534 with multiple first example flow paths 536, while FIG. 6 shows a second example layer 534 with numerous example flow paths 536, and FIG. 7 shows a third example layer 534 with several example flow paths 536.

In some such monolithic structures, each layer may be made from any of a variety of materials, including, for example, stainless steels, glass, or ceramics. In implementations using metal layers, the layers may be brazed together or otherwise bonded together. In implementations using ceramic layers, the layers may be bonded together before sintering and then sintered into a fused layer stack; the bonding material is typically burned off during the sintering process, resulting in a generally homogenous ceramic part. The layers in some such monolithic structures may be manufactured using precision machining.

Figure 8:
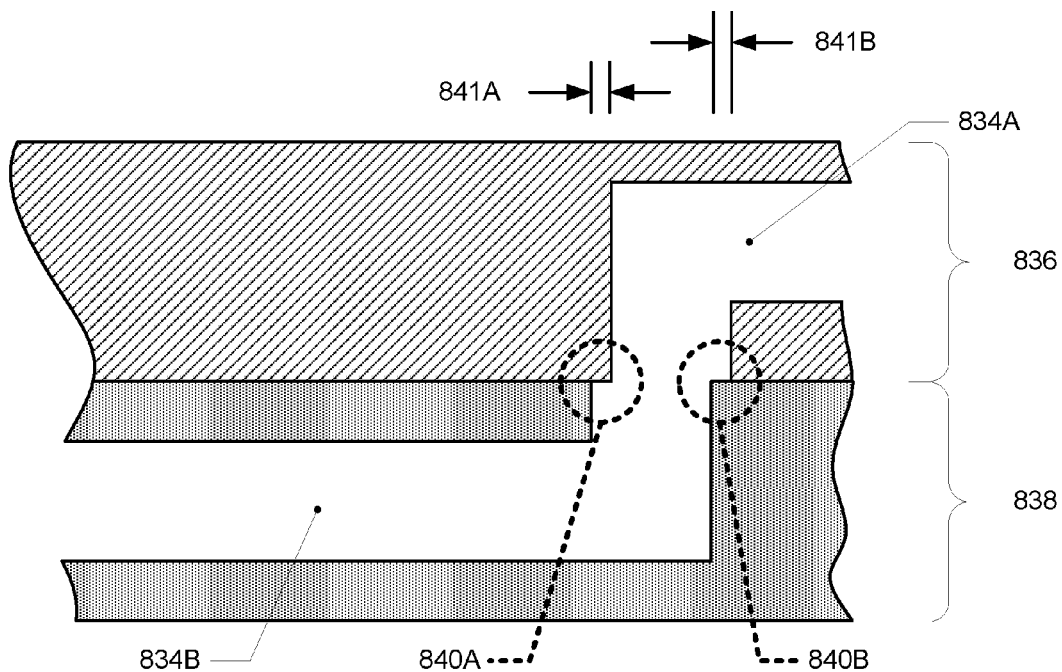
FIG. 8 depicts an example section view of a monolithic structure with a misaligned flow path.

Some potential disadvantages may exist with monolithic structures that are made from bonded or otherwise connected layers. In some such structures, the alignment between each layer may not be exact such that ridges, overlaps, gaps, and other dead zones may form within and between portions of fluidic channels, and these discontinuities may adversely affect fluid flow through a channel and/or adversely affect the structure itself. For instance, a misaligned layer at a bend of a passage may cause an overlap of one or more surfaces which may adversely affect the fluid flowing around such surfaces. FIG. 8 depicts an example section view of a monolithic structure with a misaligned flow path. As can be seen, a first layer 836 includes a first portion of a flow path 834A that is not aligned with a second portion of a flow path 834B that is located in a second layer 838. The misalignment 841A and 841B between the first layer 836 and the second layer 838 has caused discontinuities 840A and 840B to form at the junction between these layers. These discontinuities may adversely affect fluid flow through the flow path, such as creating turbulence and/or a dead volume/space, which in turn may affect the timing and control of fluid flow through the system, act as a particle source/trap, cause gases to slowly leach out of the flow path, and/or may cause a "virtual leak" in the gas delivery system, all of which may increase wafer defects and/or adversely affect wafer processing.

Figure 9:
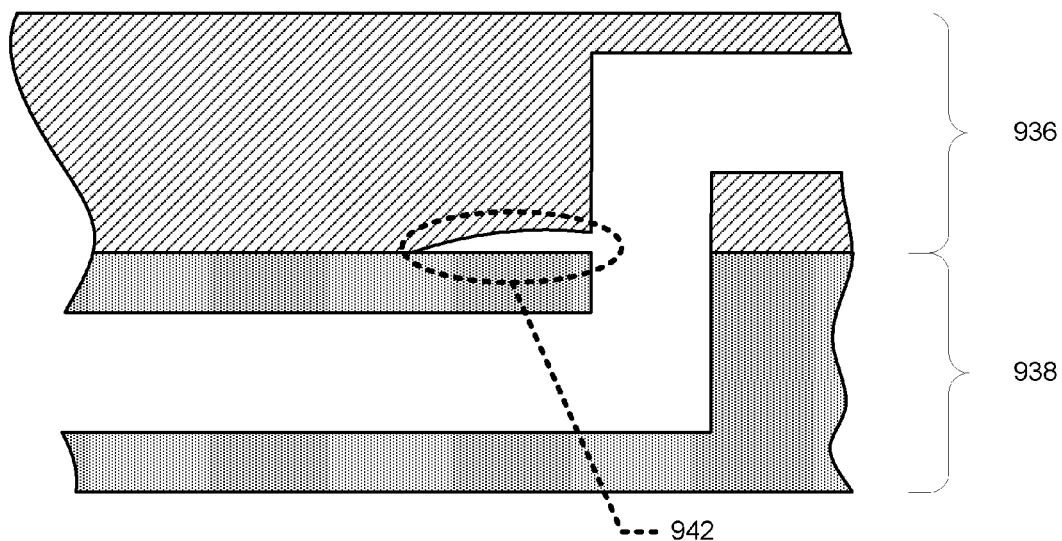
FIG. 9 depicts an example section view of a monolithic structure with a gap between two layers.

Another disadvantage of a layered monolithic structure is that one or more gaps may potentially form between two layers, e.g., due to improper or poor bonding, which may decrease structural integrity of the layered stack, as well as adversely affecting fluid flow through the structure as described above, including, for instance, creating a particle source/trap in the flow path. FIG. 9 depicts an example section view of a monolithic structure with a gap between two layers. Similar to FIG. 8, FIG. 9 includes a first layer 936 and a second layer 938, but here a gap 942 is formed between the two layers. Such a gap may case adversely affect flow through the flow path like the misalignment/discontinuities discussed above. Additionally, a gap may compromise the structural integrity of a structure, e.g., causing the layers to delaminate and/or deform; such effects may not only negatively affect fluid flow, but also lead to a catastrophic failure of structure.

The nature of constructing a monolithic structure with layers, e.g., with a ceramic and/or metal, is such that perfect alignment between each layer may not be achieved, which may therefore result in gaps, misalignments, discontinuities, and the like as discussed above.

In some instances, gas boxes may include manifolds that are monolithic structures made from a single piece of a material that may be machined to a desired configuration. In some such structures, the flow paths through the structure may be made using traditional machining techniques, although there may be numerous disadvantages to this approach. For instance, some such structures may require the creation of a long, straight flow path which may be achieved by a technique known as "gun-drilling", but this technique has limitations on allowable drill depth—for example, gun-drilled holes have a tendency to "wander" with increasing hole depth, making it difficult to ensure that two gun-drilled holes that intersect do so in an aligned manner. Accordingly, in some such structures, gun-drilling cannot create a long enough flow path through the manifold. Another disadvantage is that some gun-drilled holes may not maintain their alignment if they are drilled to deep which in turn may result in misalignment with other holes and/or components and thereby causing sharp internal edges to form which have the aforementioned disadvantages. Moreover, it is often the case that a gun-drilled flow passage may need to be plugged at the location where the gun-drilled hole exits the manifold block. Such plugs introduce additional cost and may also introduce a dead volume in the flow passage that makes purging of the flow passage difficult.

Figure 10:
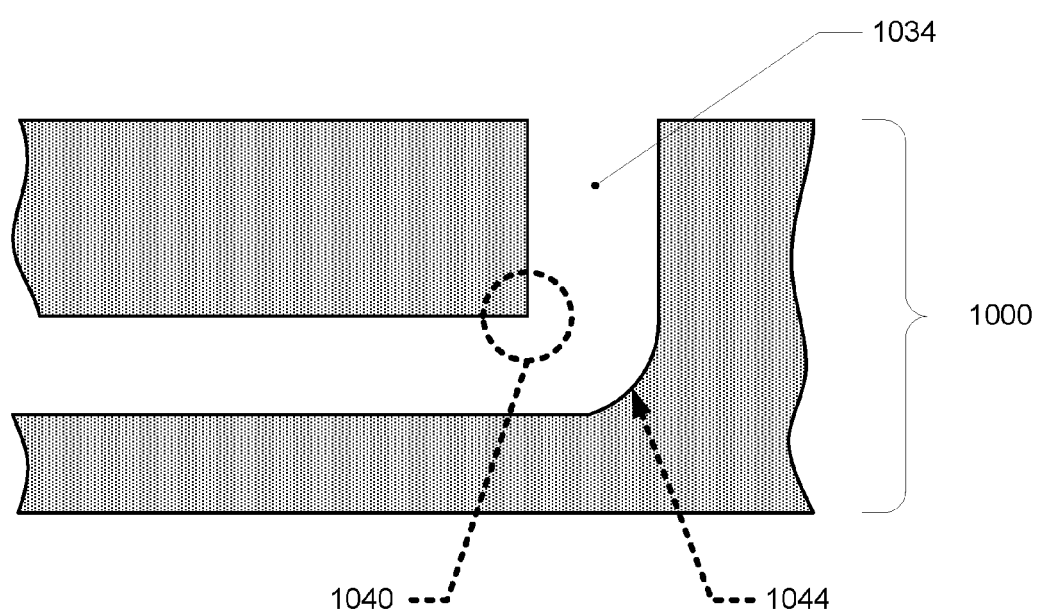
FIG. 10 depicts an example monolithic structure that has a partially-rounded and partially sharp internal bend.

Furthermore, for some such monolithic structures made from a single piece of a material, traditional manufacturing techniques are unable to create internal flow paths with smooth internal bends without any sharp edges. Flow paths with internal bends that have edges may adversely affect fluid flow by, for example, creating dead zones, turbulent flow, and/or other negative effects, which may cause, for instance, turbulence and/or condensation of precursor and/or precursor buildup. For example, some such structures may require a flow path with a 90-degree bend. One technique to create such a corner is to drill two holes through the single piece of material at 90-degree angles such that the bottoms of the holes intersect. Typically, a drill bit or end mill with a rounded or semi-rounded nose may be used, which may create a bend with a partially rounded internal edge, but, given the nature of the geometries involved, is not able to create a bend without any sharp internal edge. FIG. 10 depicts an example monolithic structure that has a partially-rounded and partially sharp internal bend. As can be seen, the example monolithic structure 1000 includes a flow path 1034 that has an internally rounded bend 1044, but also has a sharp internal edge 1040. With many traditional machining techniques, the sharp internal edge 1040 cannot be rounded.

A different example gas box may be constructed using a series of pipes, tubes, valves, and/or fittings arranged together into a desired configuration. This example gas box may include flow components, such as a mass flow controller ("MFC") and valves, which may be installed onto a frame and/or manifold block(s), and connections between some or all of these flow components may be made using tubes and/or fittings. In some such situations, the tubes may be bent to desired shapes in order to properly interconnect certain flow components. Fittings may also be used to interconnect the tubes when, among other things, the tubes cannot be bent into to a desired shape or angle. Again, numerous disadvantages exist with this type of gas box. For instance, tubes have certain bend radius limitations such that they cannot be bent too tightly or else the tubes may fail, kink, become damaged, and/or shorten the life of the tube, e.g., by virtue of work hardening due to excessive strain during a tight-radius bend. Furthermore, in order to bend a tube into some configurations, the tube must be gripped in two or more places, but depending on the configuration and/or the desired bend, gripping the tube may be impracticable and/or may damage the tube, especially if one or more bends are to be placed within a short distance of the tube. For example, making a 3-dimensional, tightly-curved serpentine design may not be possible by bending a tube. Additionally, in some such example gas boxes, some tight corners may be made using a fitting between two or more tubes. However, many typical fittings include sharp internal edges which may lead to the aforementioned adverse effects on fluid flow through the tubes and/or fittings.

While in theory some structures of a gas box manifold may be created using one or more casting techniques, which may include plaster molding, shell molding, investment casting, and lost foam casting, the present inventors determined that such techniques are generally not feasible or practical for constructing a gas box or some parts of a gas box, for semiconductor processing. For instance, investment casting is a slow (e.g., long production-cycle times and low throughput), labor intensive, and expensive process because, in some situations, the core used for the casting is thrown away after every molding, thereby requiring the creation of a core for each new casting process. The structures that can be created using casting techniques are also limited. For example, casting cannot create some intricate configurations of hollow flow passages and cannot create holes and/or passages that are smaller than a specific diameter.

The assignee of this disclosure has undertaken to fundamentally change the design of gas boxes for use in semiconductor manufacturing to make these systems more streamlined, higher functioning, more compact, and less expensive. As part of this effort, the present inventors determined that a gas box with a manifold created using additive manufacturing, e.g., three-dimensional printing, that includes: a) fluid flow components linked to a common mixing chamber by generally equal-length flow passages, b) some fluid flow components generally arranged in a circular pattern about the mixing chamber, c) three-dimensional fluid flow passages, and/or d) fluid flow passages without sharp internal edges, may significantly improve fluid routing and delivery, manufacturability, and maintainability as compared with gas boxes using manifolds made using other techniques. Such a gas box created using additive manufacturing is not only improved over traditional gas box designs, but also improved over gas boxes that may be created using other traditional manufacturing techniques.

The above improvements may be provided by way of a manifold constructed by additive manufacturing (hereinafter "manifold") that may generally provide a mixing chamber that is fluidically connected with a plurality of flow paths arranged around the mixing chamber. Each of these fluid flow paths may lead to one or more fluid flow component interfaces, via one or more tubular passages, which may interface with a fluid flow component such that the fluid flow paths may be used to deliver a process gas or liquid to the mixing chamber.

Figure 11:
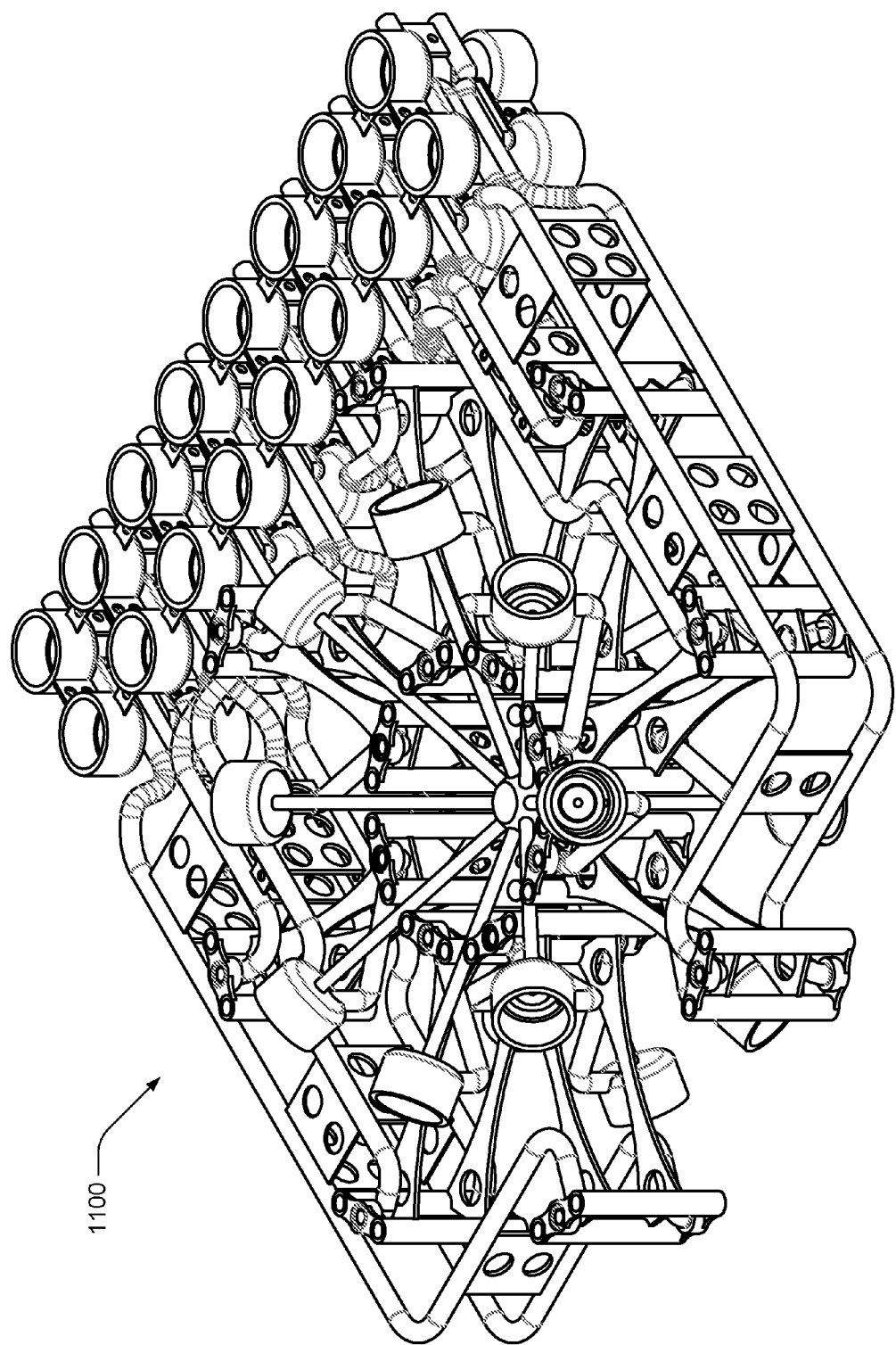
FIG. 11 depicts an isometric view of an example manifold created by additive manufacturing.
Figure 12:
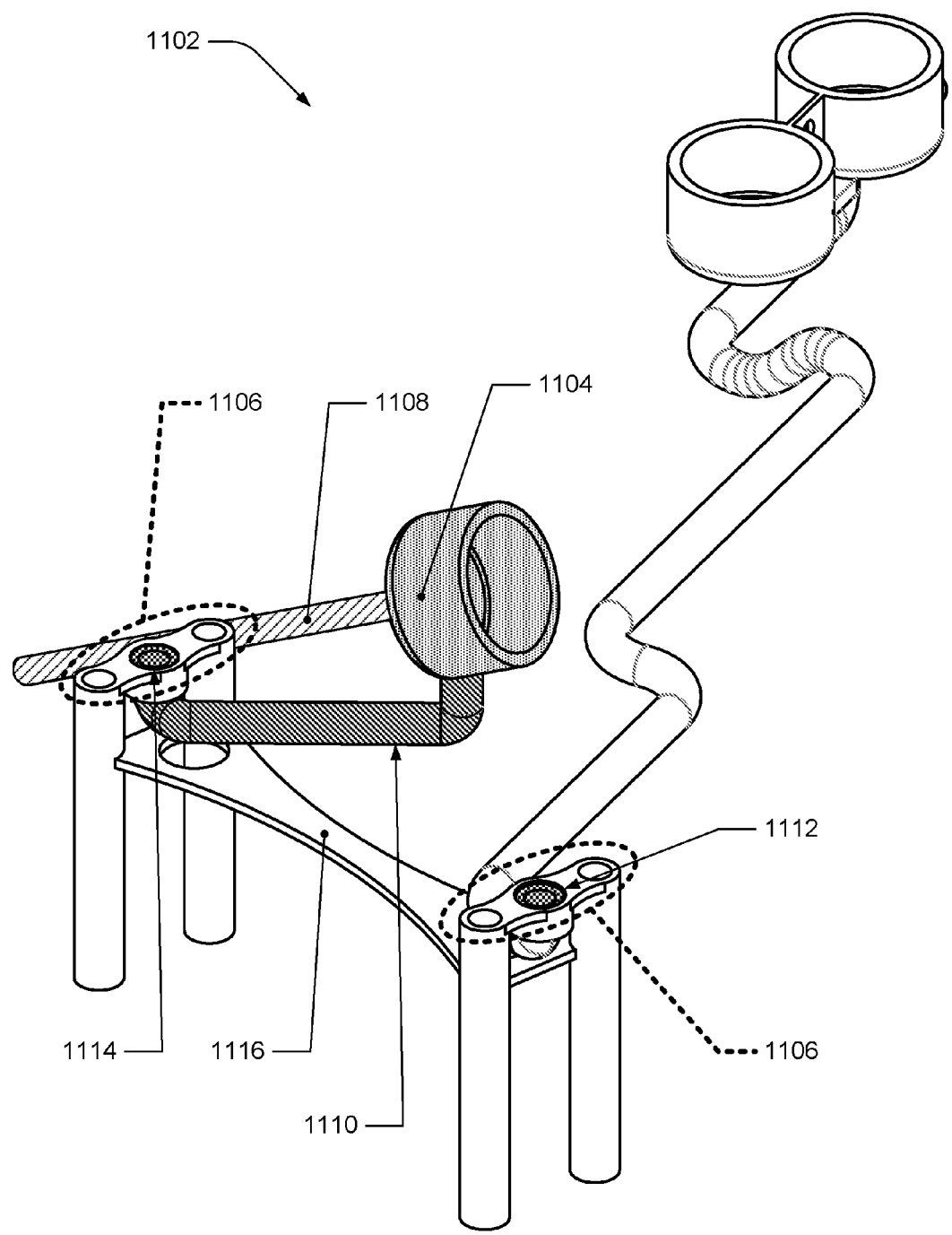
FIG. 12 depicts an isometric view of one isolated flow path from the example manifold of FIG. 11.
Figure 13:
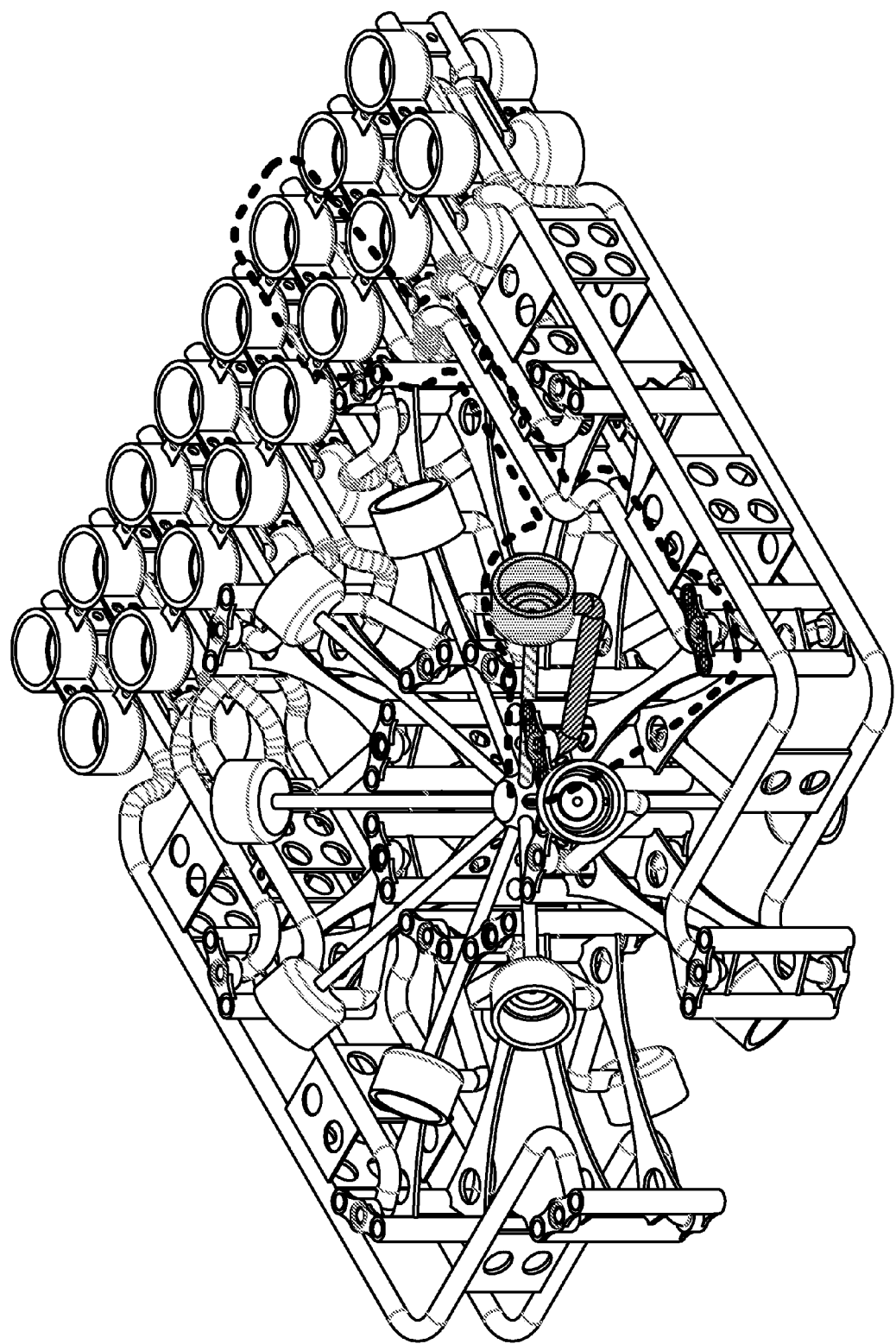
FIG. 13 depicts an isometric view of the manifold of FIG. 11 with a first flow path identified inside a dashed line.

FIG. 11 depicts an isometric view of an example manifold 1100 created by additive manufacturing. FIG. 12 depicts an isometric view of one isolated flow path from the example manifold 1100 of FIG. 11. FIG. 13 depicts an isometric view of the manifold of FIG. 11 with the first flow path identified inside the dashed line. As can be seen in FIG. 12, the isolated first flow path 1102 (hereinafter "the first flow path") includes a first fluid flow component interface 1104 shown with shading, a second fluid flow component interface 1106 identified by the dashed ellipses, a first tubular passage 1108 shown with cross-hatching, and a second tubular passage 1110 shown with a different cross-hatching. The second fluid flow component interface 1106 includes a second fluid flow component interface inlet 1112 and a second fluid flow component interface outlet 1114, both of which are identified with shading, connected to each other by a structural support 1116. The first tubular passage 1108 is fluidically connected to the mixing chamber (identified as 1154 in FIGS. 14 and 15) such that fluid may flow from the first tubular passage 1108 into the mixing chamber 1154.

In some embodiments, the first fluid flow component interface 1104, the second fluid flow component interface 1106, the first tubular passage 1108, and the second tubular passage 1110 of each flow path are separate from the first fluid flow component interfaces, the second fluid flow component interfaces, the first tubular passages, and the second tubular passages of the other flow paths in the manifold, although such flow paths may all eventually flow into the same mixing chamber. This type of separation between flow paths is illustrated in at least FIGS. 11, 15, 25, and 29, and their corresponding discussions.

Figure 14:
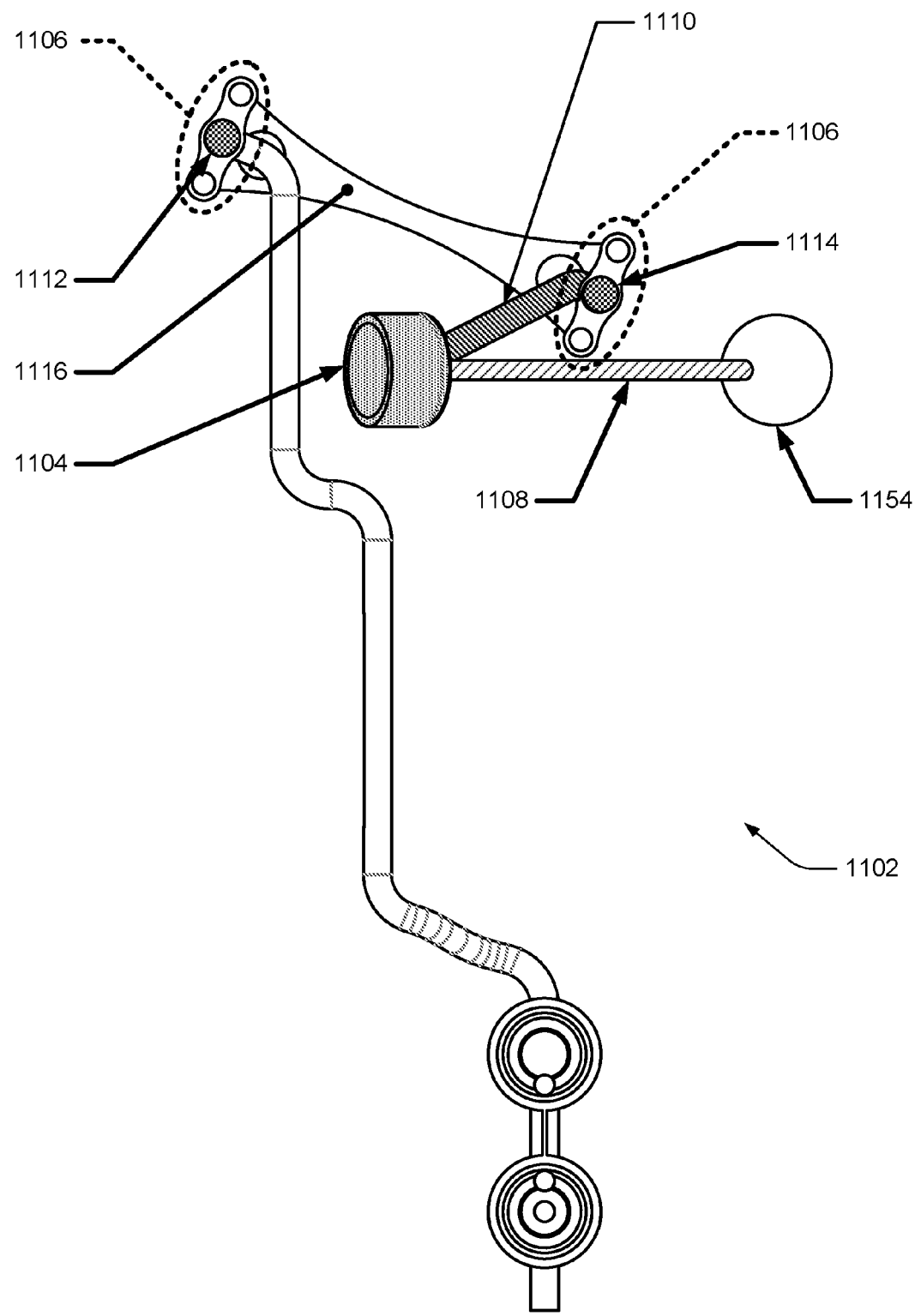
FIG. 14 shows a plan view of the first flow path of FIG. 12 from the same viewpoint of FIG. 15.
Figure 15:
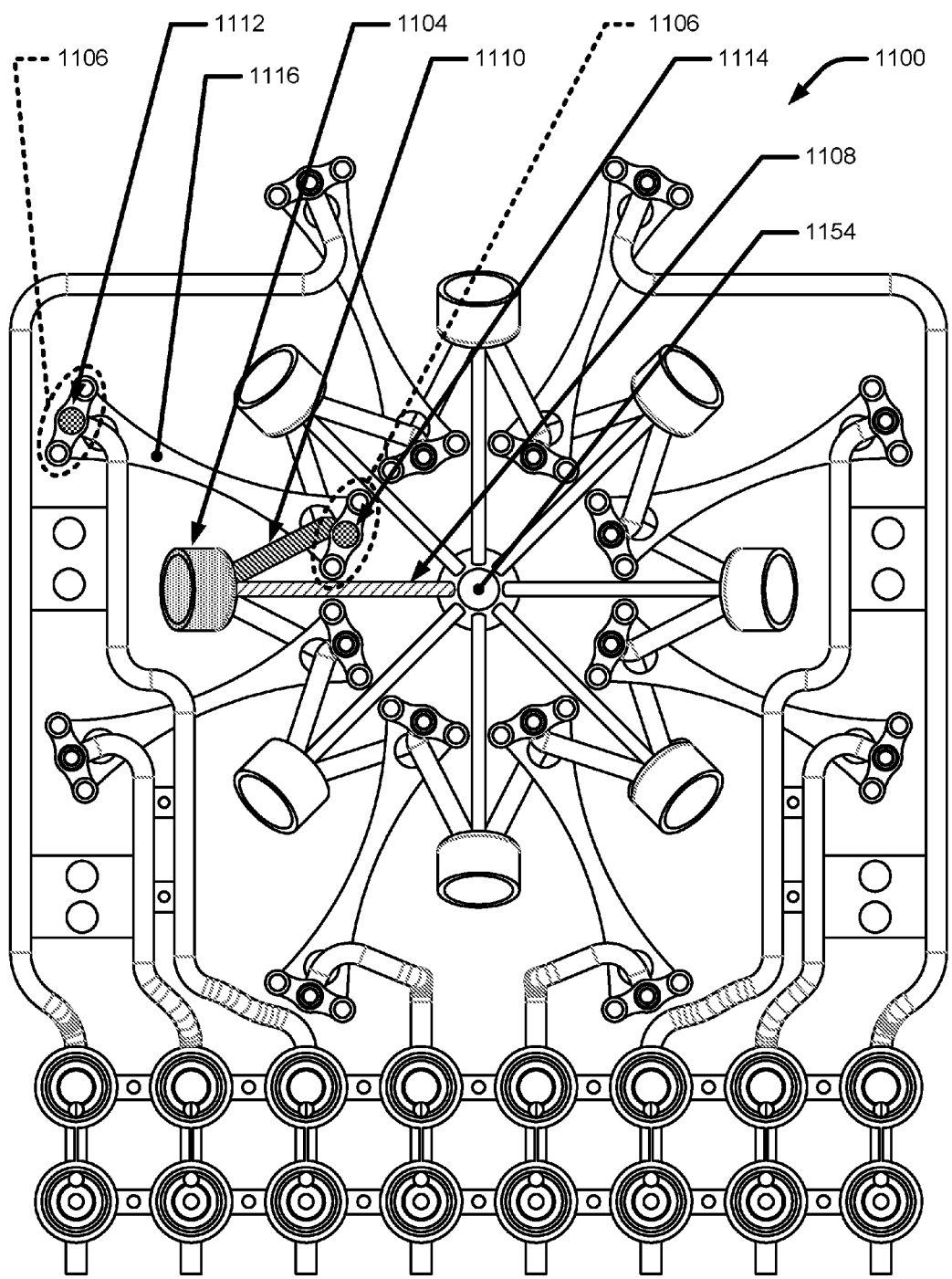
FIG. 15 depicts a plan view of the first flow path of FIG. 12 in the manifold.

FIG. 14 shows a plan view of the first flow path of FIG. 12 from the same viewpoint of FIG. 15. Here in FIG. 14, the first flow path is shown with the same elements identified in FIG. 12. The mixing chamber 1154, which is fluidically connected with the first tubular passage 1108, is also included in FIG. 14. Similarly, FIG. 15 depicts a plan view of the first flow path of FIG. 12 in the manifold. As can be seen, the same elements in FIGS. 12 and 14 are highlighted, including the mixing chamber 1154.

Like with the second fluid flow component interface 1106, the first fluid flow component interface 1104 similarly includes a first fluid flow component interface inlet 1118 and a first fluid flow component interface outlet 1120 which cannot be seen in FIG. 12, but can be seen in FIGS. 16 and 17. FIG. 16 depicts an off angle view of the first flow path 1102 of FIG. 12, and FIG. 17 depicts a detail view of a portion of the first flow path 1102 from FIG. 16. In FIG. 16, the flow path 1102 is rotated and angled from FIG. 12 such that the inside of the first fluid flow component interface 1104 can be viewed. The portion of flow path 1102 encircled by the dashed line in FIG. 16 is enlarged in FIG. 17 in order to view the first fluid flow component interface inlet 1118 and the first fluid flow component interface outlet 1120, which are holes that are identified by shading.

Referring back to FIGS. 12, 14, 16, and 17, the first flow path 1102 may be arranged such that the first tubular passage 1108 fluidically connects a first mixing chamber (identified as mixing chamber 1154 on FIG. 15) with the first fluid flow component interface outlet 1120, and the second tubular passage 1110 fluidically connects the first fluid flow component interface inlet 1118 and the second fluid flow component interface outlet 1114. The first fluid flow component interface 1104 may be fluidically interposed between the first tubular passage 1108 and the second tubular passage 1110. The first fluid flow component interface 1104 may also be configured to interface with a corresponding first fluid flow component (not shown) such that the corresponding first fluid flow component, when installed, is able to interact with fluid flow between the first fluid flow component interface inlet 1118 and the first fluid flow component interface outlet 1120. For example, in some embodiments the first fluid flow component may be a valve that may be configured to regulate fluid flow through the first fluid flow component interface 1104. In some other embodiments the fluid flow component may be a mass flow controller, a regulator, a sensor, and/or a measuring device.

In some embodiments, a fluid flow component interface may be configured to interface with a fluid flow component by using a surface-mount interface. In some such embodiments, a surface-mount fluid flow component may be configured to be mounted to a flat surface with an inlet and an outlet port (these interfaces will generally include seals). Such a face-mount fluid flow component will generally have internal flow paths or flow recesses that, when the fluid flow component is mounted to the flat surface, serve to define a contained flow path for the gas or liquid that is routed through the fluid flow component. For example, the second fluid flow component interface 1106 depicted in at least FIG. 12 is a surface mount interface. As can be seen in FIG. 12, the second fluid flow component interface 1106 includes two separate flat surfaces, each within a dashed ellipse, that are the surfaces on which a fluid flow component mounts. Each flat surface of the second fluid flow component interface 1106 also includes an inlet or outlet, i.e., the second fluid flow component interface inlet 1112 and the second fluid flow component interface outlet 1114, such that a flow path between the second fluid flow component interface inlet 1112 and the second fluid flow component interface outlet 1114 is created when a second fluid flow component is interfaced with the second fluid flow component interface 1106.

In some other embodiments, a fluid flow component interface may be configured to interface with a fluid flow component by using a threaded bore-type interface. In some such embodiments, the fluid flow component interface may be of a cylindrical shape and/or may include a threaded bore such that a threaded fluid flow component, such as a valve, may connect with the fluid flow component interface. One such example is discussed below and shown in FIGS. 18 and 19.

Figure 18:
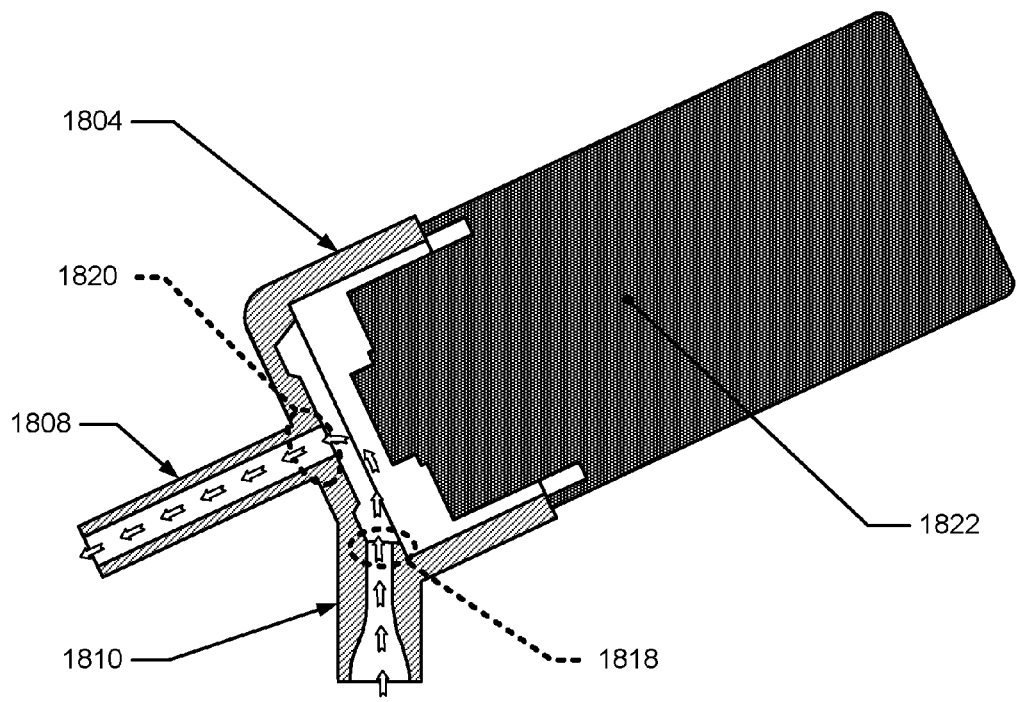
FIG. 18 depicts a cross-sectional view of an example fluid flow component interfaced with a first fluid flow component interface.
Figure 19:
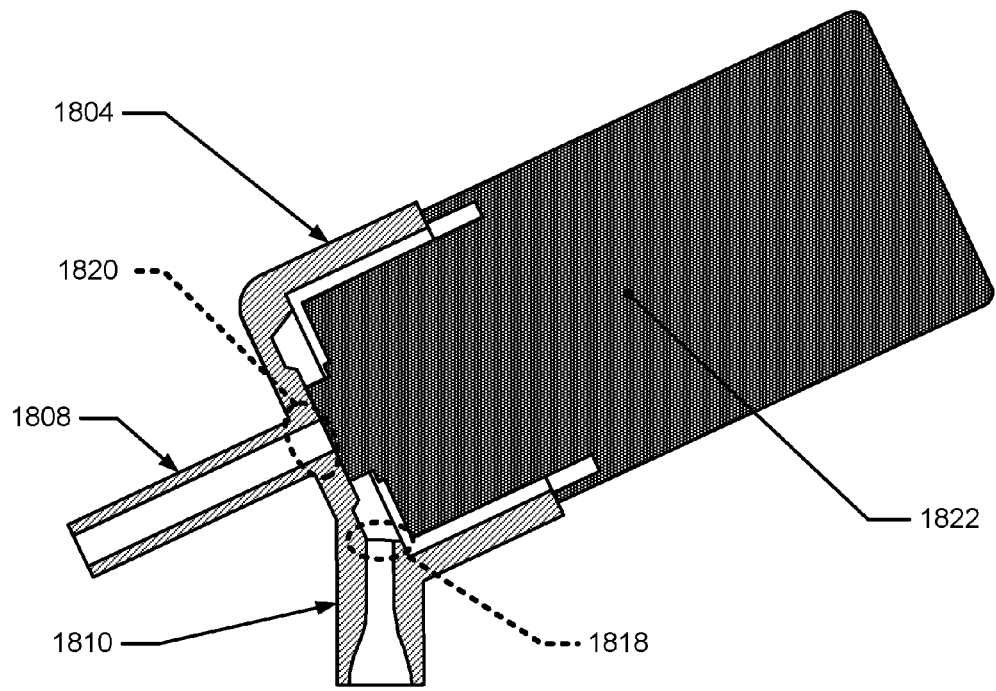
FIG. 19 depicts another cross-sectional view of the example fluid flow component interface of FIG. 18.

FIG. 18 depicts a cross-sectional view of an example fluid flow component interfaced with a first fluid flow component interface. As can be seen, a first fluid flow component interface 1804 includes a first fluid flow component interface outlet 1820, as indicated with a dashed ellipse, that is fluidically connected to a first tubular passage 1808, and a first fluid flow component interface inlet 1818, also indicated with a dashed ellipse, that is fluidically connected to a second tubular passage 1810. The first fluid flow component interface 1804 here is configured such that a first fluid flow component 1822, which in this example is a valve, may be interfaced with the first fluid flow component interface 1804 such that the valve can regulate fluid flow between the second tubular passage 1810 and the first tubular passage 1808. The valve in FIG. 18 is shown in an "open" position such that fluid may flow through the second tubular passage 1810, into and through the first fluid flow component interface inlet 1818, into the first fluid flow component interface 1804, into and through the first fluid flow component interface outlet 1820, and into and through the first tubular passage 1808; this path is exemplified by the white arrows. FIG. 19 depicts another cross-sectional view of the example fluid flow component interface of FIG. 18. In FIG. 19, the first fluid flow component 1822 is shown in the "closed" position such that no fluid may flow between the first fluid flow component interface inlet 1818 and the first fluid flow component interface outlet 1820, and such that fluid may not flow from and through the second tubular passage 1810 to the first tubular passage 1808.

Similarly, the second fluid flow component interface 1106 may be configured to interface with a corresponding second fluid flow component such that the corresponding second fluid flow component, when installed, is able to interact with fluid flow between the second fluid flow component interface inlet 1112 and the second fluid flow component interface outlet 1114. In some embodiments, as mentioned above, the second fluid flow component may be a mass flow controller that may regulate fluid flow between the second fluid flow component interface inlet 1112 and the second fluid flow component interface outlet 1114.

In some surface-mount fluid flow component interface embodiments, a fluid flow component interface may be provided by two different, non-contiguous interface surfaces. For example, the second fluid flow component interface depicted in at least FIGS. 12 and 14, are configured such that the second fluid flow component interface 1106 includes two non-contiguous interface surfaces: a first interface surface (not labeled) that includes the second fluid flow component interface outlet 1114 as well as some mounting features, and a second interface surface (not labeled) that includes the second fluid flow component interface inlet 1112. These first and second interface surfaces are non-contiguous in that they, among other things, are not subregions of the same surface, but are provided by discrete surfaces—in this case with a large gap or open space between them, in contrast to the first fluid flow component interface 1104 depicted in at least FIGS. 12, 16, and 17. In some embodiments, the first interface surface and the second interface surface may be connected by a member, such as the structural support 1116 in FIG. 12.

In some embodiments, the first flow path 1102 may be configured such that when a first fluid flow component is interfaced with the first fluid flow component interface then fluid may flow through and from the second fluid flow component interface outlet 1114, into and through the second tubular passage 1110, into and through the first fluid flow component interface inlet 1118, into and through the first fluid flow component interface outlet 1120, into and through the first tubular passage 1108, and into the mixing chamber (1154 in FIG. 15). In some such embodiments, the flow path 1102 may also be configured such that when a second fluid flow component is interfaced with the second fluid flow component interface 1106, fluid may flow through the second fluid flow component interface inlet 1112, into and through the second fluid flow component interface outlet 1114, into and through the second tubular passage 1110, into and through the first fluid flow component interface inlet 1118, into and through the first fluid flow component interface outlet 1120, into and through the first tubular passage 1108, and into the mixing chamber.

Figure 20:
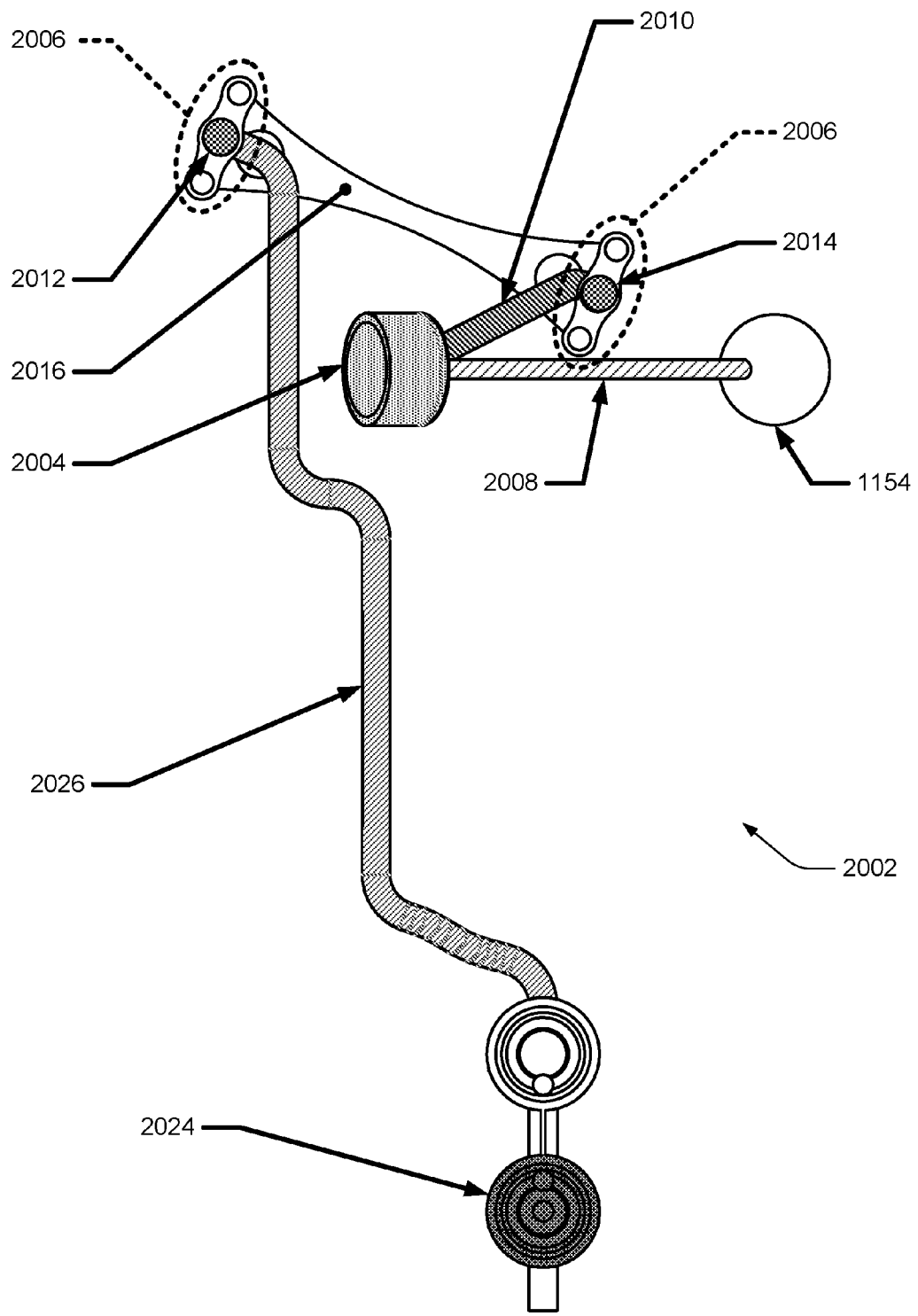
FIG. 20 depicts a plan view of a second fluid flow path that includes a third fluid flow component interface and a third tubular passage.
Figure 21:
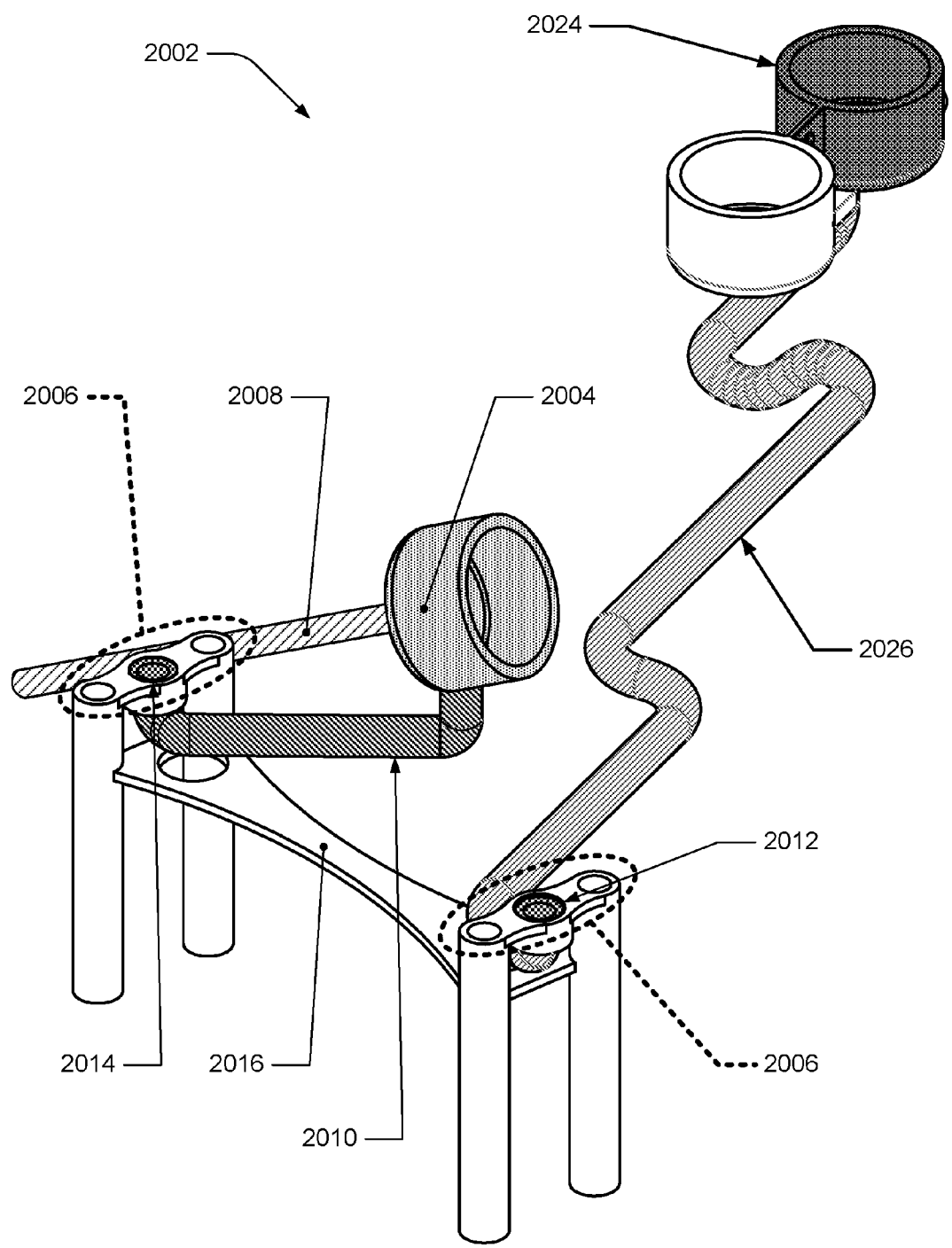
FIG. 21 depicts an isometric view of the second flow path of FIG. 20.

In some embodiments, each flow path of the manifold may also include a third fluid flow component interface, which may include a third fluid flow component interface inlet and a third fluid flow component interface outlet, and each flow path may also include a third tubular passage that may fluidically connect the second fluid flow component interface inlet of that flow path with the third fluid flow component interface outlet of that flow path. FIG. 20 depicts a plan view of a second fluid flow path that includes a third fluid flow component interface and a third tubular passage; FIG. 21 depicts an isometric view of the second flow path of FIG. 20. The second flow path 2002 may be similar to or identical to the first flow path 1102 discussed above and shown in at least FIGS. 12 and 14. For instance, the second flow path 2002 may include the same elements as the first flow path 1102 and may be configured similarly. Here in FIG. 20, the second flow path 2002 includes a first fluid flow component interface 2004 shown with shading, a second fluid flow component interface 2006 identified by the dashed circles, a first tubular passage 2008 shown with cross-hatching, and a second tubular passage 2010 shown with a different cross-hatching. The second fluid flow component interface 2006 includes a second fluid flow component interface inlet 2012 and a second fluid flow component interface outlet 2014, both of which are identified with shading, and which are connected to each other by a structural support 2016. As stated above, these items may be configured similarly and/or identically to the first flow path 1102 such that, for instance, the second tubular passage 2010 fluidically connects the second fluid flow component interface outlet 2014 with the first fluid flow component interface inlet (not shown).

Figure 22:
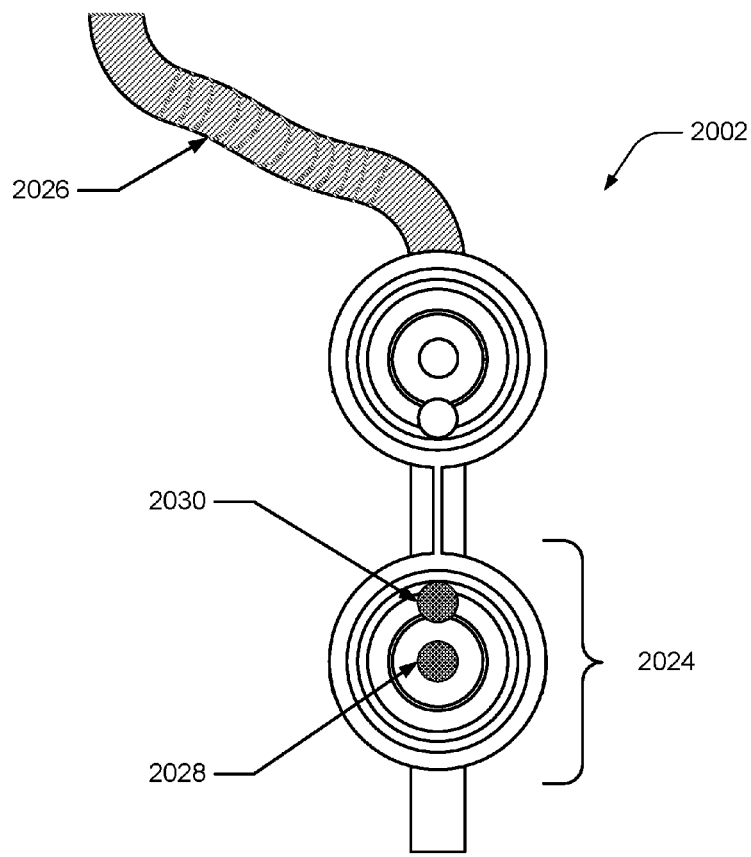
FIG. 22 depicts a plan view of a portion of the second flow path of FIG. 20 showing the third fluid flow component interface and a part of the third tubular passage.
Figure 23:
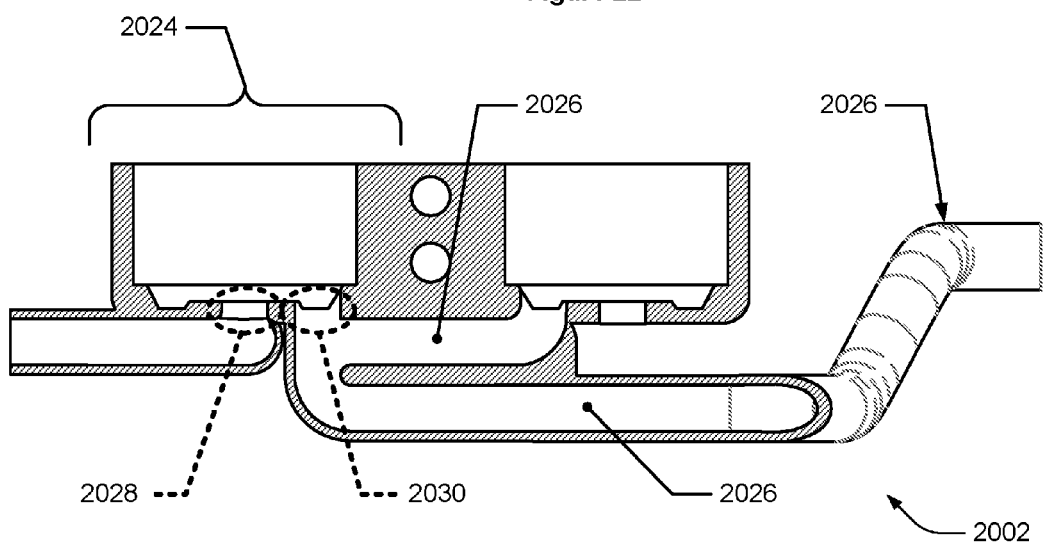
FIG. 23 depicts a cross-sectional view of the portion of the second flow path from FIG. 22.

The second flow path 2002 in FIG. 20 also includes a third fluid flow component interface 2024 and a third tubular passage 2026. The third fluid flow component interface 2024 may include a third fluid flow component interface inlet and a third fluid flow component interface outlet, which can be seen in FIGS. 22 and 23. FIG. 22 depicts a plan view of a portion of the second flow path 2002 showing the third fluid flow component interface 2024 and a part of the third tubular passage 2026. The third fluid flow component interface 2024 includes a third fluid flow component interface inlet 2028 and a third fluid flow component interface outlet 2030. FIG. 23 depicts a cross-sectional view of the portion of the second flow path from FIG. 22. As can be seen, the third fluid flow component interface 2024 includes the third fluid flow component interface inlet 2028 and the third fluid flow component interface outlet 2030, and the third the third tubular passage 2026 is fluidically connected to the third fluid flow component interface outlet 2030. In some embodiments, fluid may flow from the third fluid flow component interface 2024, through the third tubular passage 2026, and to the second fluid flow component interface inlet 2012. The second fluid flow component interface 2006 may also be fluidically interposed between the second tubular passage 2010 and the third tubular passage 2026 of that flow path.

Similar to the first and second fluid flow component interfaces, 2004 and 2006, respectively, the third fluid flow component interface 2024 may be configured to interface with a corresponding third fluid flow component (not shown) such that the corresponding third fluid flow component, when installed, is able to interact with fluid flow between the third fluid flow component interface inlet 2028 and the third fluid flow component interface outlet 2030. In some such embodiments, the third fluid flow component interface 2024 may be configured such that the third fluid flow component may be able to regulate flow between the third fluid flow component interface inlet 2028 and the third fluid flow component interface outlet 2030, as described above and shown in FIGS. 18 and 19.

Figure 24:
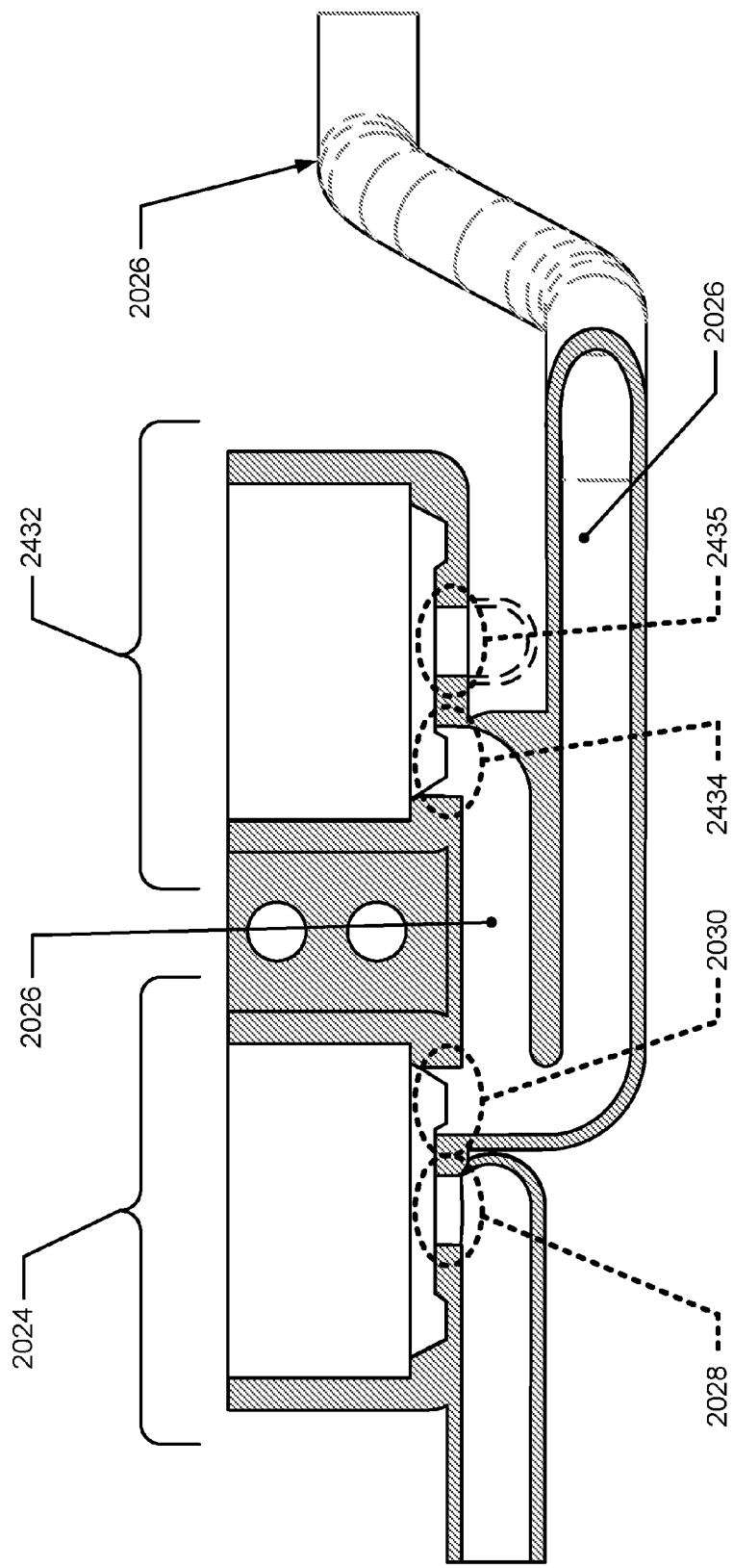
FIG. 24 depicts the same portion of the cross-sectional view of the portion of the second flow path from FIG. 23, but identifies additional features of a fourth fluid flow component interface.

In some embodiments, the manifold may include a flow path that also includes a fourth fluid flow component interface which may include a fourth fluid flow component interface inlet. FIG. 24 depicts the same portion of the cross-sectional view of the portion of the second flow path 2002 from FIG. 23, but identifies additional features of a fourth fluid flow component interface 2432. The fourth fluid flow component interface 2432 is, in this example, part of the second example flow path 2002 and includes a fourth fluid flow component interface inlet 2434 that is fluidically connected to the third tubular passage 2026 and a fourth fluid flow component interface outlet 2435 that is fluidically connected to the fourth fluid flow component interface 2432. In some embodiments, the fourth fluid flow component interface outlet 2435 may be fluidically connected to other components, such as a manifold and/or fourth fluid flow components interface outlets of other flowpaths in the manifold. This may include an additively-manufactured tubular passage, not identified but shown with dashed lines directly below the fourth fluid flow component interface outlet 2435, that travels in a path perpendicular to the page and in between the third tubular passage 2026 and the fourth fluid flow component interface 2432, which may provide a fluid to the fourth fluid flow component interface outlet 2435. This additively-manufactured tubular passage may be a common passage for all such instances of the depicted valve seat arrangement. In some embodiments, the fourth fluid flow component interface 2432 may be used to introduce a purge gas for purging the corresponding flow path. Furthermore, similar to the other fluid flow component interfaces discussed above, the fourth fluid flow component interface 2432 may be configured to interface with a corresponding fourth fluid flow component (not shown) such that the corresponding fourth fluid flow component, when installed, is able to interact with fluid flow of the third tubular passage.

Figure 25:
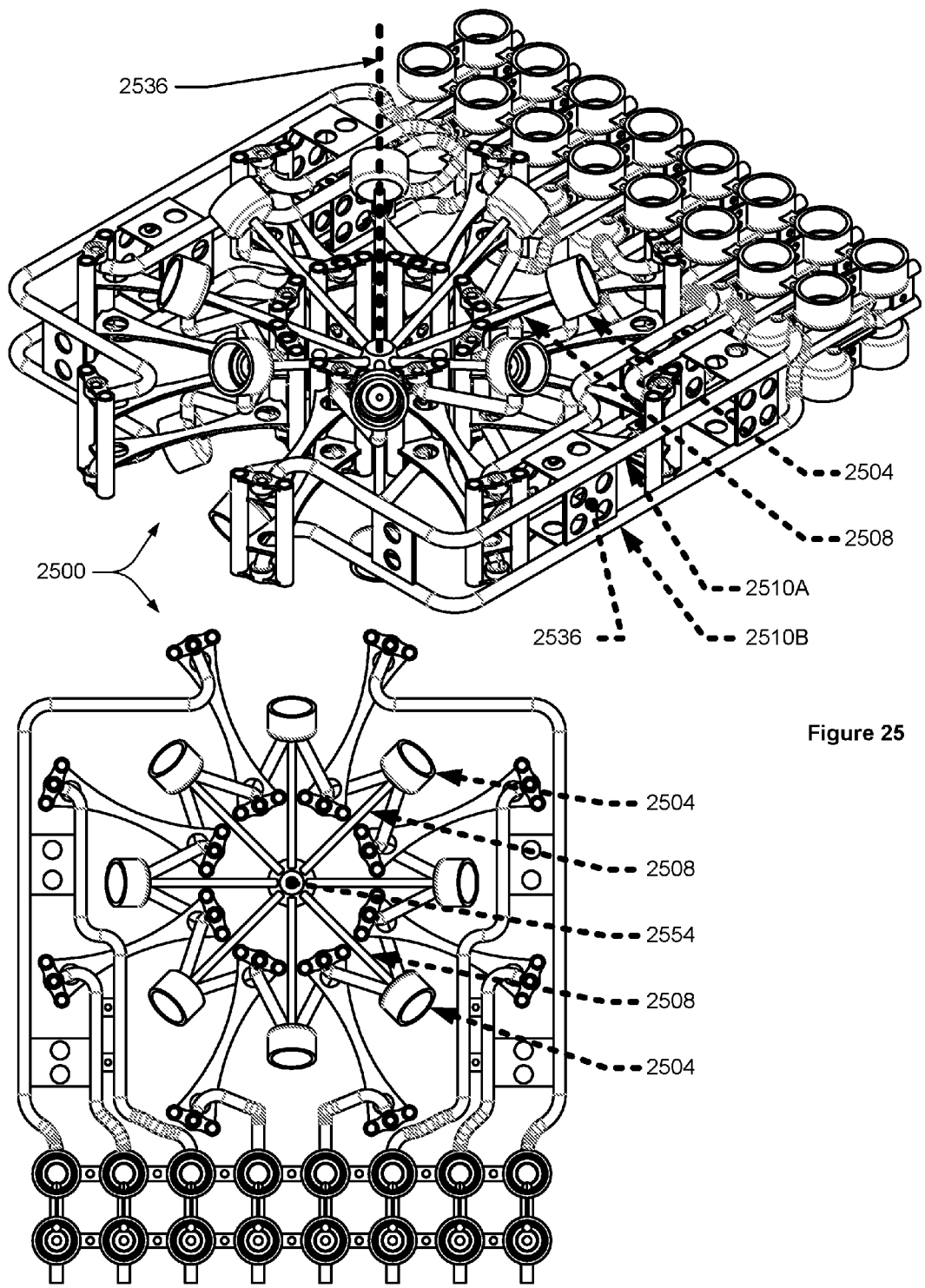
FIG. 25 depicts both an isometric view (top) and a plan view (bottom) of a manifold.

Referring back to the manifold 1100 of FIG. 11, in some embodiments, the first tubular passages and the first fluid flow component interfaces may be arranged in a radial pattern around a first axis. FIG. 25 depicts both an isometric view (top) and a plan view (bottom) of a manifold 2500. A first axis 2536 is shown in the isometric view which is parallel to the viewing angle of the plan view, e.g. "into the page" of the plan view. For illustration purposes, some of the first fluid flow components 2504 and first tubular passages 2508 are identified.

In some embodiments, at least two of the first tubular passages of the manifold may be the same length. In some such embodiments, each of the first tubular passages may be the same length as the other first tubular passages, such as is illustrated with the first tubular passages in 2508, as well as the first tubular passages in at least FIGS. 11, 13, and 15. In some embodiments, having two or more first tubular passages of equal length may allow for more consistent and/or controllable fluid delivery to the mixing chamber 2554. For example, the first tubular passages may have the same lengths and diameters, and thus equal effective flow resistances, which may generally cause the fluids flowing down the first tubular passages to have the same transit times and arrive at the same time at the mixing chamber introduced into the first tubular passages at the same time and under similar flow conditions. In the case of the example manifold 2500, the first tubular passages and the second tubular passages of each flow path are, in effect, identically sized and routed. Thus, the effective flow resistance in each flow path between the mixing chamber and the second fluid flow component interface may, in at least this example, be the same, allowing for fluids that are introduced into two or more of the second tubular passages under similar flow conditions to reach the mixing chamber, in effect, simultaneously.

In some embodiments, the manifold may also include one or more structural supports which may span between two or more elements of the manifold. In some such embodiments, the structural supports may be membranes or webs that span between two or more portions of a single element. For instance, the structural support 1116 spans between multiple elements of the second fluid flow component interface 1106. In some embodiments, the structural supports may span between (a) one or more portions of one of the flow paths that may include the first tubular passage of that flow path, the second tubular passage of that flow path, the first fluid flow component interface of that flow path, or the second fluid flow component interface of that flow path, and (b) one or more portions of one of one of the other flow paths that may include the first tubular passage of that other flow path, the second tubular passage of that other flow path, the first fluid flow component interface of that other flow path, or the second fluid flow component interface of that other flow path. For example, as can be seen in the isometric manifold of FIG. 25, a structural support 2516 spans between a second tubular passage 2510A of one flow path and a second tubular passage 2510B of a different flow path. A structural support may also span between one or more elements of a flow path and one or more other elements of the manifold, such as the mixing chamber or another structural support.

In some embodiments, at least one flow path in the manifold may have a tubular passage, such as a first tubular passage, that follows a three-dimensional path. For example, the first flow path 1102 that is isolated and shown in FIGS. 12 and 14 includes a second tubular passage 1110 that follows a three-dimensional path, which is a three-dimensional path between the first fluid flow component interface inlet 1118 and the second fluid flow component interface outlet 1114. A manifold 1100 constructed with additive manufacturing enables the creation of tubular passages that may follow many different and varied three-dimensional flow paths which are not constrained by traditional manufacturing techniques, as described herein.

In some embodiments, one or more portions of one or more bends in a tubular passage may have a bend radius less than ten times the outer diameter of the tube of the diameter of the tubular passage, and potentially less than just the outer diameter. As stated above, traditional metal tubes have bend radius limits which prevent the tubes from being bent beyond a certain radius since the bending process may cause strain in the bent tube that may cause undesired deformation (such as flattening the tube cross-section into an oval from a circle), wrinkling, or localized strain-hardening that may compromise the integrity of the tube; additionally, such strain may lead to decreased corrosion resistance in the tube material at the bend locations, which poses a safety and performance hazard. With additive manufacturing, however, bends of tubular passages in a manifold, such as manifold 1100, may be made to nearly any bend radius, including bend radii smaller than the minimum bend radii achievable using actual tubing bending techniques—since such bends are formed as part of the additive manufacturing process, there are no risks of cross-section deformation, wrinkling, or work-hardening as seen with bent tubing. This allows manifolds such as those described herein to provide compact fluid routing with tighter turns than may be achieved using traditional tubing bending techniques. Some examples of tubular passages that include bends with bend radii lower than the bend radius limits for traditional manufacturing techniques may be seen with the second tubular passage 1110 in FIG. 12, the third tubular passage 2026 in FIGS. 20 and 24. As can be seen, these tubular passages may not only bend beyond normal manufacturability limits, but also follow three-dimensional paths in that are in close proximity to one another and that may be without any sharp internal edges. Such configurations are not achievable by other traditional manufacturing methods.

Figure 26:
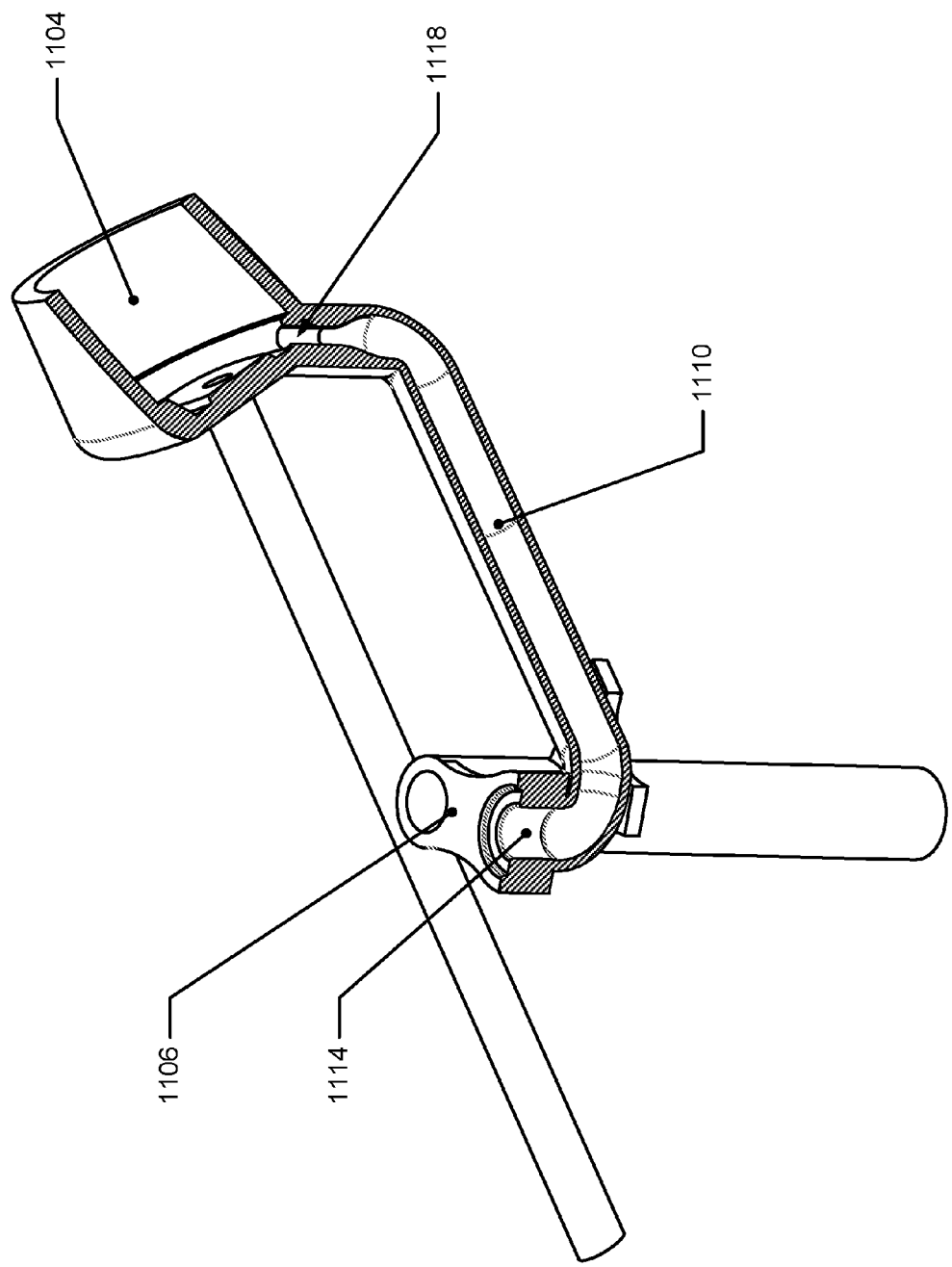
FIG. 26 depicts an isometric cross-sectional view of the second tubular passage from the first flow path of FIG. 12.

Furthermore, in some embodiments, one or more tubular passages of a manifold may have a plurality of bends and at least some of the bends may be free of internal sharp edges. In some such embodiments, at least 85% or more of the plurality of bends of one or more of the tubular passages may be free of internal sharp edges. In some such embodiments, each first tubular passage may have a plurality of first bends and 85% or more of the first bends may be free of internal sharp edges, and each second tubular passage may have a plurality of second bends and 85% or more of the second bends may be free of internal sharp edges. For example, FIG. 26 depicts an isometric cross-sectional view of the second tubular passage 1110 from the first flow path 1102 of FIG. 12. A cross-sectional cut has been made through the second fluid flow component interface 1106, the second fluid flow component interface outlet 1114, the second tubular passage 1110, the first fluid flow component interface inlet 1118, and the first fluid flow component interface 1104. As can be seen, the second tubular passage 1110 includes a plurality of bends that are all, e.g., more than 85%, free of internal sharp edges.

Figure 27:
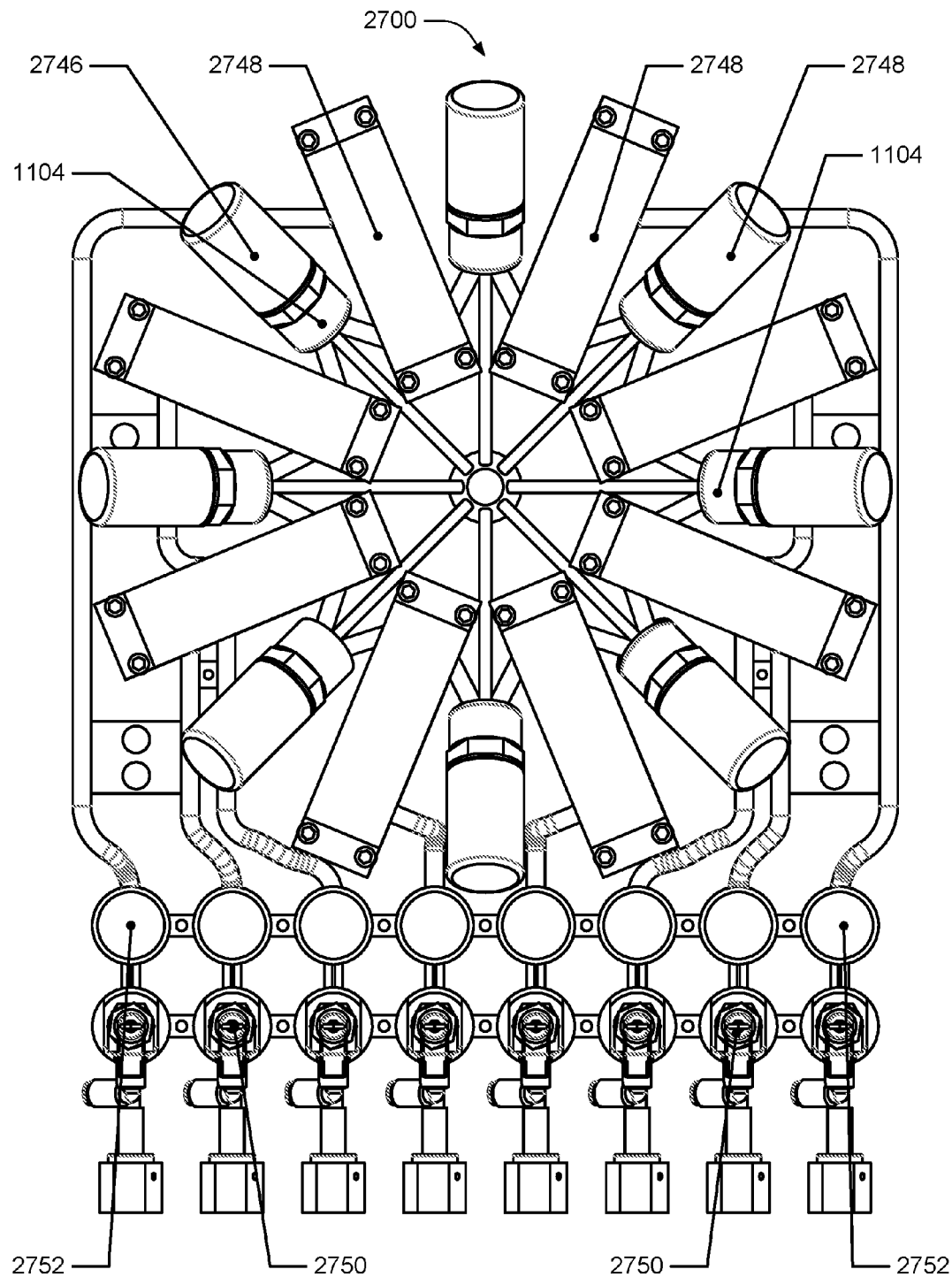
FIG. 27 depicts a plan view of a manifold that includes a plurality of fluid flow components interfaced with fluid flow component interfaces.
Figure 28:
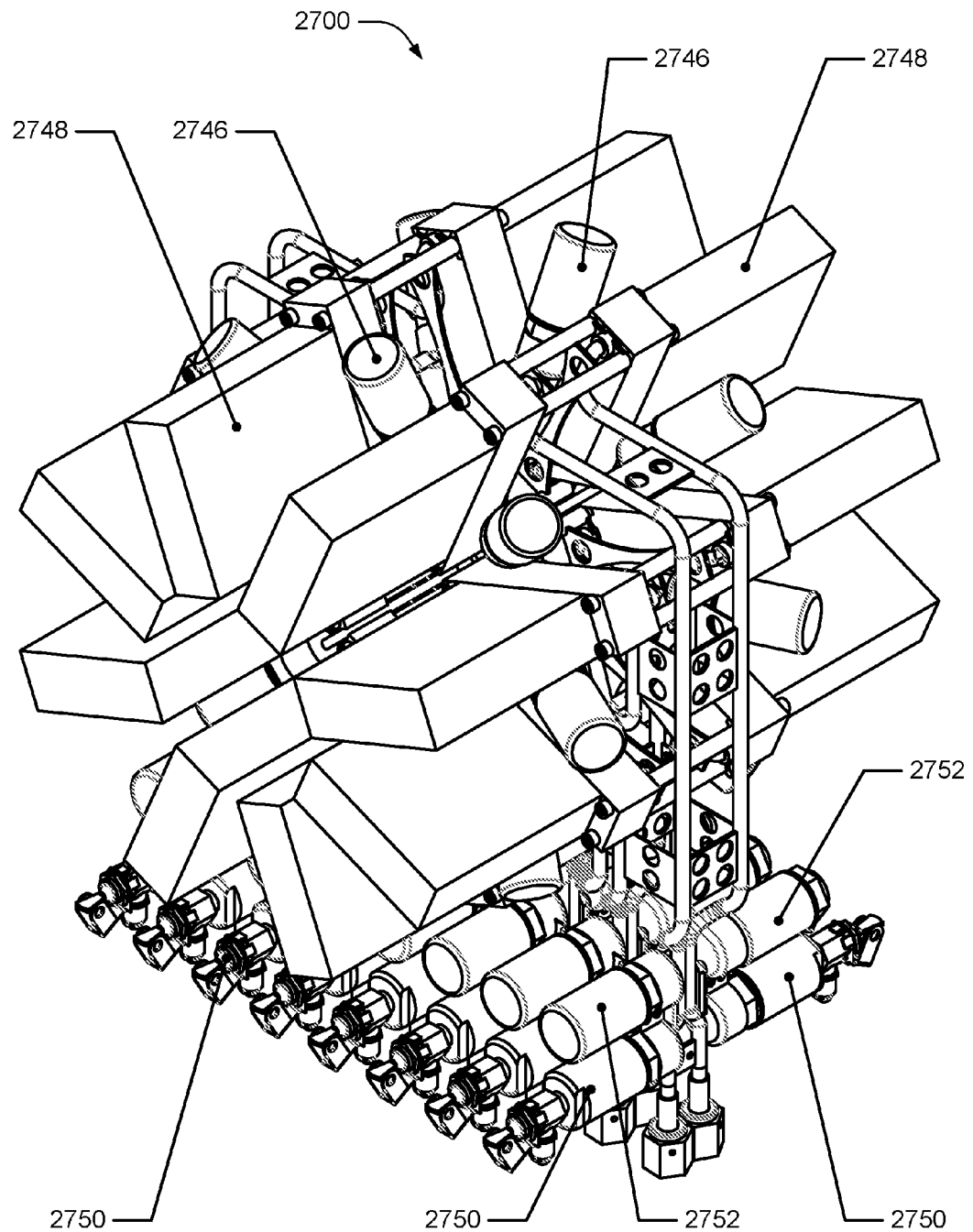
FIG. 28 depicts an isometric view of the manifold of FIG. 27.

In some embodiments, the manifold may include a plurality of first fluid flow components that are mounted to the manifold. In some such embodiments, each first fluid flow component may be fluidically connected with a corresponding one of the first fluid flow component interfaces. As discussed above, a first fluid flow component may be mounted to the manifold in any of the ways known in the art. In some such embodiments, the manifold may also include a plurality of second fluid flow components, which may also be mounted to the manifold such that each second fluid flow component may be fluidically connected with a corresponding one of the second fluid flow component interfaces. FIG. 27 depicts a plan view of a manifold that includes a plurality of fluid flow components interfaced with fluid flow component interfaces, while FIG. 28 depicts an isometric view of the manifold of FIG. 27. As can be seen in both FIGS. 27 and 28, manifold 2700 includes a plurality of first fluid flow components 2746, a plurality of second fluid flow components 2748, a plurality of third fluid flow components 2750, and a plurality of fourth fluid flow components 2752 that are interfaced with corresponding fluid flow component interfaces on the manifold 2700. For instance, each first fluid flow component 2746 is interfaced with a corresponding first fluid flow component interface 1104 and each second fluid flow component 2748 is interface with a corresponding second fluid flow component interface (not labeled). In the example of FIG. 27, first fluid flow components 2746, third fluid flow components 2750, and fourth fluid flow components 2752, are all a type of valve, whereas the second fluid flow components 2748 are MFCs.

The manifold 2700 is also configured such that there may be two "sides" to the manifold. For example, manifold 2700 in FIG. 28 has one side with eight flow paths and another side with eight flow paths, totaling sixteen flow paths. Each side may be identical to the other side, and in some embodiments both sides may be made together as part of one additive manufacturing process to make the manifold.

In some embodiments, at least a majority of the manifold may have a sintered structure. In some such embodiments, at least 75% of the manifold may have a sintered structure. In some such embodiments, the manifold may also have some traditional components, as discussed above, for instance fittings and/or piping.

The manifold may also be made from a variety of materials. In some embodiments, the manifold may be constructed from a metal alloy, a metal, or a ceramic. In some such embodiments, the manifold may be made from stainless steel, such as 316L stainless steel. The manifold may also be constructed of a blend of one or more materials that may be suitable for additive manufacturing, such as alloys or super-alloys (e.g., Hastelloy). In some other embodiments, the manifold may be made from a sintered metal, a sintered metal alloy, or a sintered ceramic.

In some embodiments, the interior surface of one or more tubular passages may have a specific average surface roughness. In some such embodiments, one or more of the tubular passages of the manifold, such as the first and/or second tubular passages, may have an interior surface with an arithmetic average surface roughness ($R_a$) of less than 15 microinches. The $R_a$ in some such embodiments may also be 10 microinches or less, such as 5 microinches or less. The $R_a$ may also be of a value desirable for the liquid(s) that may flow through the manifold for semiconductor processing. The desired arithmetic average surface roughness may be obtained by the additive manufacturing process and/or one or more steps performed during and/or after manufacturing, such as electropolishing or flowing a polishing slurry through one or more tubular passages of the manifold. Alternatively, a coating may be applied to the interior of the tubular flow passages in order to smooth out the interior surfaces of the passages. In some embodiments, atomic-layer deposition ("ALD") may be used to apply one or more layers of material onto some of the interior of the passages to achieve the desired $R_a$. It is also to be understood that some features of the manifolds discussed herein may be subjected to post-additive-manufacturing machining processes, e.g., if there are valve seats/sealing surfaces or threaded interfaces, such features may be added after additive manufacturing is completed since such the surface finishes and tolerances of such features may be impossible to achieve using additive manufacturing techniques (future advances in additive manufacturing techniques may allow such features to be created directly in the additive manufacturing process, however).

Figure 29:
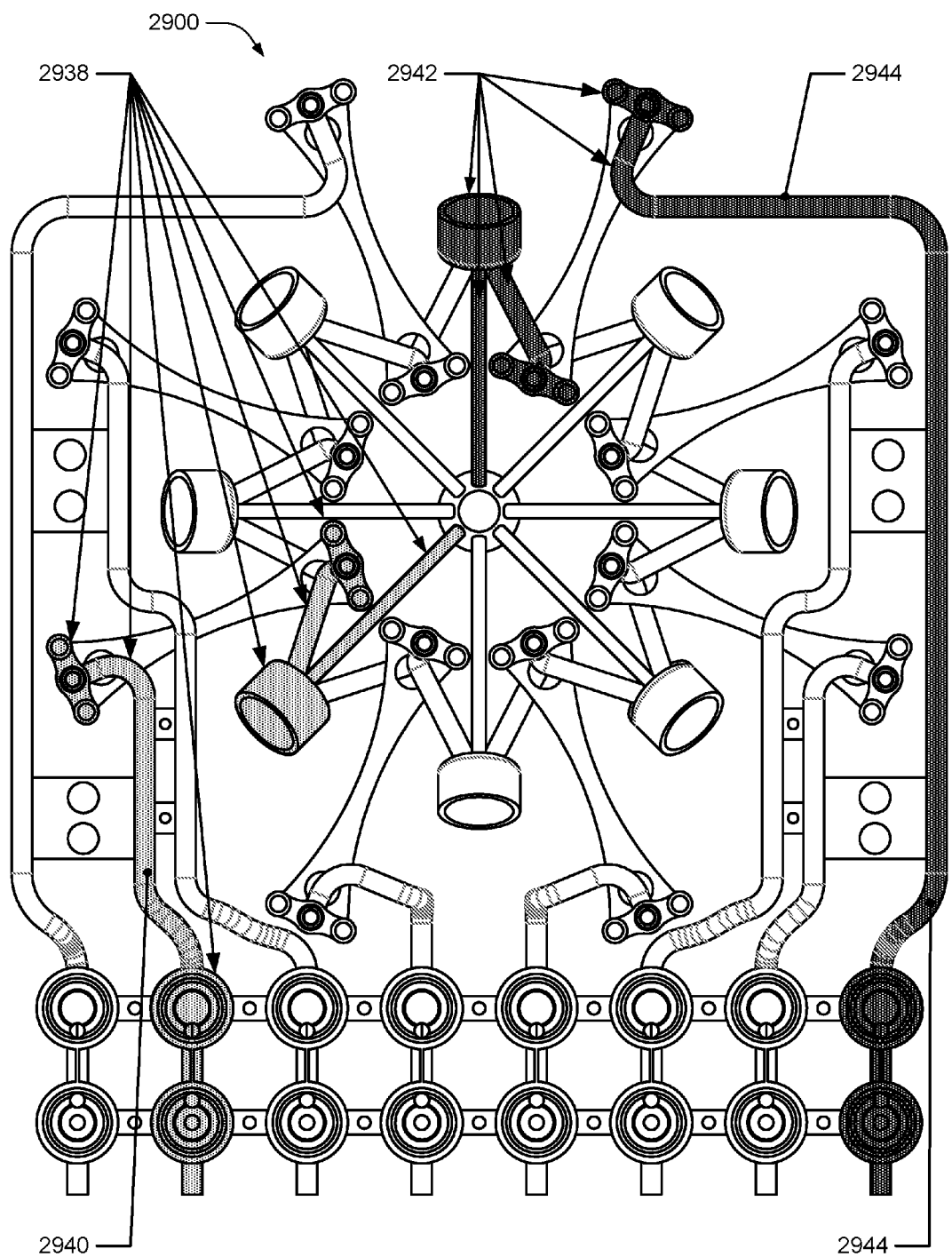
FIG. 29 depicts two different flow paths of a manifold.

The manifold flow paths may be arranged in various configurations. In some such embodiments, the manifold may include two or more different flow paths, such that each different flow path travels a different route from the mixing chamber to the end of the flow path such that, for instance, the third tubular passages may be different lengths. For instance, FIG. 29 depicts two different flow paths of a manifold. Manifold 2900 includes a third example flow path 2938 on the left side of the Figure in light shading, with a third tubular passage identified as 2940, and a fourth example flow path 2942 on the right side of the Figure in dark shading, with a fourth tubular passage identified as 2944. In this example, the third tubular passage 2940 of the third example flow path and the fourth tubular passage 2944 of the fourth example flow path are different lengths. In some embodiments, at least one first tubular passage may be a different length than another first tubular passage; similarly at least one second tubular passage may be a different length from another second tubular passage. In some embodiments, all of the first tubular passages may be the same length and the second tubular passages may also be all the same length, such as depicted in at least FIG. 11.

In some embodiments, the manifold may have one or more flow paths. In some embodiments, the manifold may have eight flow paths while is some other embodiments, the manifold may have sixteen flow paths, while in others there may be twenty flow paths. For example, the manifold in FIG. 25 has sixteen flow paths.

The inner and/or outer diameters of the tubular passages of one or more flow paths may also vary. In some embodiments, the majority of the outer diameters of the tubular passages in all the flow paths of a manifold may be the same, while the majority of the inner diameters of such tubular passages may also be substantially equal, e.g. within 90% of each other. In some embodiments, one or more portions of the interior diameters of some tubular passages may include tapering or varying diameter. For instance, the second tubular passage 1110 depicted in FIG. 26 includes an inner diameter that is identical for the majority of the length of the passage, but it also includes tapering towards the end of the passage that is located on the right side of FIG. 26. In some embodiments, the interior diameter for some tubular passages of the manifold may range from about 0.25 inches to about 0.187 inches, while in some other embodiments, the interior diameters may range from 0.5 inches to about 0.0625 inches.

The manifold may also be of varying size and volume. In some embodiments, a significant portion of the manifold may be empty space. In some such embodiments, the manifold may occupy 35% or less of the smallest prismatic rectangular volume that may completely contain the manifold. In some such embodiments, the height and width of the smallest prismatic rectangular volume may range between about 15 inches and about 20 inches. For instance, such a height and width may both be about 18 inches.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. An apparatus comprising:
a manifold constructed by additive manufacturing, the manifold including:
  a first mixing chamber;
  one or more structural supports; and
  portions of a plurality of flow paths, each flow path including:
    a first fluid flow component interface including a first fluid flow component interface inlet and a first fluid flow component interface outlet;
    a second fluid flow component interface including a second fluid flow component interface inlet and a second fluid flow component interface outlet;
    a first tubular passage fluidically connecting the first mixing chamber with the first fluid flow component interface outlet of that flow path; and
    a second tubular passage fluidically connecting the first fluid flow component interface inlet of that flow path with the second fluid flow component interface outlet of that flow path, wherein:
    the plurality of flow paths includes a first flow path and a second flow path,
    the first fluid flow component interface, the second fluid flow component interface, the first tubular passage, and the second tubular passage of each flow path are a unitary body,
    each first fluid component interface is fluidically interposed between the first tubular passage of that flow path and the second tubular passage of that flow path,
    each first fluid flow component interface is configured to interface with a corresponding first fluid flow component such that the corresponding first fluid flow component, when installed, is able to interact with fluid flow between the first fluid flow component interface inlet and the first fluid flow component interface outlet of that first fluid flow component interface,
    each second fluid flow component interface is configured to interface with a corresponding second fluid flow component such that the corresponding second fluid flow component, when installed, is able to interact with fluid flow between the second fluid flow component interface inlet and the second fluid flow component interface outlet of that second fluid flow component interface, and
    each structural support spans between:
      an item of the first flow path selected from the group consisting of: the first tubular passage, the second tubular passage, the first fluid flow component interface, and the second fluid flow component interface, and
      an item of the second flow path selected from the group consisting of: the first tubular passage, the second tubular passage, the first fluid flow component interface, and the second fluid flow component interface.

2. The apparatus of claim 1, wherein, for at least one of the flow paths, at least one of the first tubular passage and the second tubular passage follows a three-dimensional path.

3. The apparatus of claim 1, wherein at least the majority of the manifold has a sintered structure.

4. The apparatus of claim 1, wherein the manifold is made from a material selected from the group consisting of a sintered metal, a sintered metal alloy, and a sintered ceramic.

5. The apparatus of claim 1, wherein each first fluid flow component interface is configured to interface with the corresponding first fluid flow component such that the first corresponding fluid flow component, when installed, is able to interact with fluid flow between the first fluid flow component interface inlet and the first fluid flow component interface outlet by regulating the fluid flow between the first fluid flow component interface inlet and the first fluid flow component interface outlet.

6. The apparatus of claim 1, wherein each second first fluid flow component interface is configured to interface with the corresponding second fluid flow component such that the corresponding second fluid flow component, when installed, is able to interact with fluid flow between the second fluid flow component interface inlet and the second fluid flow component interface outlet by regulating the fluid flow between the second fluid flow component interface inlet and the second fluid flow component interface outlet.

7. The apparatus of claim 1, wherein each fluid flow path further comprises:
  a third fluid flow component interface including a third fluid flow component interface inlet and a third fluid flow component interface outlet; and
  a third tubular passage fluidically connecting the second fluid flow component interface inlet of that flow path with the third fluid flow component interface outlet of that flow path, wherein:
    each second fluid flow component interface is fluidically interposed between the second tubular passage of that flow path and the third tubular passage of that flow path, and
    each third fluid flow component interface is configured to interface with a corresponding third fluid flow component such that the corresponding third fluid flow component, when installed, is able to interact with fluid flow between the third fluid flow component interface inlet and the third fluid flow component interface outlet.

8. The apparatus of claim 7, wherein each third fluid flow component interface is configured to interface with the corresponding third fluid flow component such that the corresponding third fluid flow component, when installed, is able to interact with fluid flow between the third fluid flow component interface inlet and the third fluid flow component interface outlet by regulating the fluid flow between the third fluid flow component interface inlet and the third fluid flow component interface outlet.

9. The apparatus of claim 7, wherein each fluid flow path further comprises:

a fourth fluid flow component interface including a fourth fluid flow component interface inlet and a fourth fluid flow component outlet; and a fourth tubular passage fluidically connecting the fourth fluid flow component interface inlet of that flow path with the third tubular passage of that flow path, wherein:

each fourth fluid flow component interface outlet is fluidically connected to the fourth fluid flow component interface, and each fourth fluid flow component interface is configured to interface with a corresponding fourth fluid flow component such that the corresponding fourth fluid flow component, when installed, is able to interact with fluid flow between the fourth fluid flow component interface inlet and the fourth fluid flow component interface outlet.

10. The apparatus of claim 1, wherein the first tubular passages and the first fluid flow component interfaces are arranged in a radial pattern around a first axis.

11. The apparatus of claim 1, wherein one or more portions of one or more bends in the first tubular passage have a bend radius less than ten times the outside diameter of the first tubular passage.

12. The apparatus of claim 1, wherein one or more portions of one or more bends in the second tubular passage have a bend radius less than ten times the outside diameter of the second tubular passage.

13. The apparatus of claim 1, wherein:
each first tubular passage has a plurality of first bends and 85% or more of the first bends are free of internal sharp edges, and
each second tubular passage has a plurality of second bends and 85% or more of the second bends are free of internal sharp edges.

14. The apparatus of claim 1, wherein, for at least one of the flow paths, at least one of the first fluid flow component interface and the second fluid flow component interface is a bore-type interface.

15. The apparatus of claim 1, wherein, for at least one of the flow paths, at least one of the first fluid flow component interface and the second fluid flow component interface is a surface mount interface.

16. The apparatus of claim 1, wherein, for at least one of the flow paths, at least one of the first fluid flow component interface and the second fluid flow component interface is an interface provided by two different, non-contiguous interface surfaces.

17. The apparatus of claim 1, further comprising a plurality of first fluid flow components, wherein each first fluid flow component is mounted to the manifold such that each first fluid flow component is fluidically connected with a corresponding one of the first fluid flow component interfaces.

18. The apparatus of claim 17, further comprising a plurality of second fluid flow components, wherein each second fluid flow component is mounted to the manifold such that each second fluid flow component is fluidically connected with a corresponding one of the second fluid flow component interfaces.

19. The apparatus of claim 1, wherein each of the first tubular passages is the same length as the other first tubular passages.

20. The apparatus of claim 1, wherein:
one or more of the first tubular passages has an interior surface with an arithmetic average surface roughness ($R_a$) of 10 microinches or less, and
one or more of the second tubular passages has an interior surface with an arithmetic average surface roughness ($R_a$) of 10 microinches or less.

21. The apparatus of claim 1, wherein the manifold occupies 35% or less of the smallest prismatic rectangular volume that can completely contain the manifold.

22. The apparatus of claim 21, wherein the height and the width of the smallest prismatic rectangular volume that can completely contain the manifold each measure between about 15 inches and about 20 inches.

23. An apparatus comprising:
a manifold constructed by additive manufacturing, the manifold including:
a mixing chamber; and
portions of a plurality of flow paths, each flow path including:
a first fluid flow component interface including a first fluid flow component interface inlet and a first fluid flow component interface outlet;
a second fluid flow component interface including a second fluid flow component interface inlet and a second fluid flow component interface outlet;
a first tubular passage fluidically connecting the first mixing chamber with the first fluid flow component interface outlet of that flow path; and
a second tubular passage fluidically connecting the first fluid flow component interface inlet of that flow path with the second fluid flow component interface outlet of that flow path, wherein:
the first fluid flow component interface, the second fluid flow component interface, the first tubular passage, and the second tubular passage of each flow path are a unitary body,
each first fluid component interface is fluidically interposed between the first tubular passage of that flow path and the second tubular passage of that flow path,
each first fluid flow component interface is configured to interface with a corresponding first fluid flow component such that the corresponding first fluid flow component, when installed, is able to interact with fluid flow between the first fluid flow component interface inlet and the first fluid flow component interface outlet of that first fluid flow component,
each second fluid flow component interface is configured to interface with a corresponding second fluid flow component such that the corresponding second fluid flow component, when installed, is able to interact with fluid flow between the second fluid flow component interface inlet and the second fluid flow component interface outlet of that second fluid flow component interface, and
one or more portions of one or more bends in the second tubular passage have a bend radius less than ten times the outside diameter of the second tubular passage.

* * * * *